(12) United States Patent
Harris et al.

(10) Patent No.: US 7,609,141 B2
(45) Date of Patent: Oct. 27, 2009

(54) FLEXIBLE CIRCUIT HAVING OVERVOLTAGE PROTECTION

(75) Inventors: Edwin James Harris, Oak Park, IL (US); Timothy Pachla, Berwyn, IL (US); Tushar Vyas, Streamwood, IL (US)

(73) Assignee: Littelfuse, Inc., Des Plaines, IL (US)

( * ) Notice: Subject to any disclaimer, the term of this patent is extended or adjusted under 35 U.S.C. 154(b) by 29 days.

(21) Appl. No.: 11/679,061

(22) Filed: Feb. 26, 2007

(65) Prior Publication Data
US 2007/0146941 A1 Jun. 28, 2007

Related U.S. Application Data

(60) Division of application No. 10/958,442, filed on Oct. 5, 2004, now Pat. No. 7,183,891, which is a continuation-in-part of application No. 10/746,020, filed on Dec. 23, 2003, now Pat. No. 7,132,922, which is a continuation-in-part of application No. 10/410,393, filed on Apr. 8, 2003, now Pat. No. 7,202,770.

(60) Provisional application No. 60/370,975, filed on Apr. 8, 2002.

(51) Int. Cl.
*H01C 7/10* (2006.01)
(52) U.S. Cl. .............. 338/21; 338/20; 338/314; 361/111; 257/536
(58) Field of Classification Search .............. 338/21, 338/20, 67, 204, 312, 314; 29/623, 825; 361/111, 137; 257/536–538
See application file for complete search history.

(56) References Cited

U.S. PATENT DOCUMENTS

| 2,273,704 | A | 2/1942 | Grisdale |
|---|---|---|---|
| 2,796,505 | A | 6/1957 | Bocciarelli |
| 2,978,665 | A | 4/1961 | Vernet et al. |
| 3,243,753 | A | 3/1966 | Kohler |
| 3,351,882 | A | 11/1967 | Kohler et al. |
| 3,591,526 | A | 7/1971 | Kawashima et al. |
| 3,619,725 | A | 11/1971 | Soden et al. |
| 3,685,026 | A | 8/1972 | Wakabayashi et al. |
| 3,685,028 | A | 8/1972 | Wakabayashi et al. |
| 3,742,420 | A | 6/1973 | Harden, Jr. |
| 3,743,897 | A | 7/1973 | Harden, Jr. |
| 3,772,774 | A | 11/1973 | Knippenberg et al. |
| 3,823,217 | A | 7/1974 | Kampe |
| 3,858,144 | A | 12/1974 | Bedard et al. |

(Continued)

FOREIGN PATENT DOCUMENTS

CA 1254323 A1 5/1989

(Continued)

*Primary Examiner*—Kyung Lee
(74) *Attorney, Agent, or Firm*—Duane Morris LLP

(57) ABSTRACT

A first voltage variable material ("VVM") includes an insulative binder, first conductive particles with a core and a shell held in the insulating binder and second conductive particles without a shell held in the insulating binder; a second VVM includes an insulating binder, first conductive particles with a core and a shell held in the insulating binder, second conductive particles without a shell held in the insulating binder, and semiconductive particles with a core and a shell held in the insulating binder; a third VVM includes only first conductive particles with a core and a shell held in the insulating binder.

20 Claims, 15 Drawing Sheets

U.S. PATENT DOCUMENTS

| | | |
|---|---|---|
| 3,913,219 A | 10/1975 | Lichtblau |
| 3,972,765 A | 8/1976 | Kondo et al. |
| 4,045,712 A | 8/1977 | DeTommasi |
| 4,124,747 A | 11/1978 | Murer et al. |
| 4,164,725 A | 8/1979 | Wiebe |
| 4,169,816 A | 10/1979 | Tsien |
| 4,177,376 A | 12/1979 | Horsma et al. |
| 4,177,446 A | 12/1979 | Diaz |
| 4,198,744 A | 4/1980 | Nicolay |
| 4,223,209 A | 9/1980 | Diaz |
| 4,252,692 A | 2/1981 | Taylor et al. |
| 4,259,657 A | 3/1981 | Ishikawa et al. |
| 4,272,471 A | 6/1981 | Walker |
| 4,278,706 A | 7/1981 | Barry |
| 4,304,987 A | 12/1981 | van Konynenburg |
| 4,318,220 A | 3/1982 | Diaz |
| 4,327,351 A | 4/1982 | Walker |
| 4,329,726 A | 5/1982 | Middleman et al. |
| 4,330,703 A | 5/1982 | Horsma et al. |
| 4,330,704 A | 5/1982 | Jensen |
| 4,331,948 A | 5/1982 | Malinaric et al. |
| 4,359,414 A | 11/1982 | Mastrangelo |
| 4,367,168 A | 1/1983 | Kelly |
| 4,383,942 A | 5/1983 | Davenport |
| 4,388,607 A | 6/1983 | Toy et al. |
| 4,426,546 A | 1/1984 | Hotta et al. |
| 4,503,415 A | 3/1985 | Rooney et al. |
| 4,514,718 A | 4/1985 | Birx |
| 4,518,646 A | 5/1985 | Nichols, Jr. |
| 4,533,896 A | 8/1985 | Belopolsky |
| 4,540,969 A | 9/1985 | Sugar |
| 4,547,830 A | 10/1985 | Yamauchi |
| 4,548,740 A | 10/1985 | von Tomkewitsch et al. |
| 4,554,732 A | 11/1985 | Sadlo et al. |
| 4,559,579 A | 12/1985 | Val |
| 4,612,529 A | 9/1986 | Gurevich et al. |
| 4,617,609 A | 10/1986 | Utner et al. |
| 4,626,818 A | 12/1986 | Hilgers |
| 4,652,848 A | 3/1987 | Hundrieser |
| 4,671,984 A | 6/1987 | Maeda et al. |
| 4,685,025 A | 8/1987 | Cartomagno |
| 4,689,475 A | 8/1987 | Kleiner et al. |
| 4,720,402 A | 1/1988 | Wojcik |
| 4,724,417 A | 2/1988 | Au et al. |
| 4,726,991 A | 2/1988 | Hyatt et al. |
| 4,749,623 A | 6/1988 | Endo et al. |
| 4,755,401 A | 7/1988 | Friedrich et al. |
| 4,771,260 A | 9/1988 | Gurevich |
| 4,774,024 A | 9/1988 | Deep et al. |
| 4,792,781 A | 12/1988 | Takahashi et al. |
| 4,800,253 A | 1/1989 | Kleiner et al. |
| 4,801,785 A | 1/1989 | Chan et al. |
| 4,837,520 A | 6/1989 | Golke |
| 4,857,880 A | 8/1989 | Au et al. |
| 4,869,930 A | 9/1989 | Clarke et al. |
| 4,873,506 A | 10/1989 | Gurevich |
| 4,878,038 A | 10/1989 | Tsai |
| 4,882,466 A | 11/1989 | Friel |
| 4,884,163 A | 11/1989 | Deep et al. |
| 4,907,340 A | 3/1990 | Fang et al. |
| 4,910,389 A | 3/1990 | Sherman et al. |
| 4,924,074 A | 5/1990 | Fang et al. |
| 4,928,199 A | 5/1990 | Diaz et al. |
| 4,959,262 A | 9/1990 | Charles et al. |
| 4,971,726 A | 11/1990 | Maeno et al. |
| 4,975,551 A | 12/1990 | Syvertson |
| 4,977,357 A | 12/1990 | Shrier |
| 4,980,541 A | 12/1990 | Shafe et al. |
| 4,992,333 A | 2/1991 | Hyatt |
| 5,002,637 A | 3/1991 | Toyoshima et al. |
| 5,068,061 A | 11/1991 | Knobel et al. |
| 5,068,634 A | 11/1991 | Shrier |
| 5,084,691 A | 1/1992 | Lester et al. |
| 5,089,929 A | 2/1992 | Hilland |
| 5,095,297 A | 3/1992 | Perreault et al. |
| 5,097,246 A | 3/1992 | Cook et al. |
| 5,097,247 A | 3/1992 | Doerrwaechter |
| 5,099,380 A | 3/1992 | Childers et al. |
| 5,102,506 A | 4/1992 | Tanielian et al. |
| 5,102,712 A | 4/1992 | Peirce et al. |
| 5,106,538 A | 4/1992 | Barma et al. |
| 5,106,540 A | 4/1992 | Barma et al. |
| 5,115,220 A | 5/1992 | Suuronen et al. |
| 5,136,365 A | 8/1992 | Pennisi et al. |
| 5,140,295 A | 8/1992 | Vermot-gaud et al. |
| 5,142,263 A | 8/1992 | Childers et al. |
| 5,148,141 A | 9/1992 | Suuronen |
| 5,155,462 A | 10/1992 | Morrill, Jr. |
| 5,166,656 A | 11/1992 | Badihi et al. |
| 5,173,359 A | 12/1992 | Toyoshima et al. |
| 5,183,698 A | 2/1993 | Stephenson et al. |
| 5,189,092 A | 2/1993 | Koslow |
| 5,189,387 A | 2/1993 | Childers et al. |
| 5,214,091 A | 5/1993 | Tanaka et al. |
| 5,232,758 A | 8/1993 | Juskey et al. |
| 5,246,388 A | 9/1993 | Collins et al. |
| 5,247,277 A | 9/1993 | Fang et al. |
| 5,248,517 A | 9/1993 | Shrier et al. |
| 5,250,226 A | 10/1993 | Oswai et al. |
| 5,250,228 A | 10/1993 | Baigrie et al. |
| 5,250,848 A | 10/1993 | Christie et al. |
| 5,257,003 A | 10/1993 | Mahoney |
| 5,260,848 A | 11/1993 | Childers |
| 5,262,754 A | 11/1993 | Collins |
| 5,268,665 A | 12/1993 | Iwao |
| 5,273,815 A | 12/1993 | Brydon et al. |
| 5,278,535 A | 1/1994 | Xu et al. |
| 5,290,821 A | 3/1994 | Sakurai et al. |
| 5,294,374 A | 3/1994 | Martinez et al. |
| 5,297,438 A | 3/1994 | Alles et al. |
| 5,303,523 A | 4/1994 | Hand et al. |
| 5,335,137 A | 8/1994 | English et al. |
| 5,340,641 A | 8/1994 | Xu |
| 5,340,775 A | 8/1994 | Carruthers et al. |
| 5,351,026 A | 9/1994 | Kanbara et al. |
| 5,363,082 A | 11/1994 | Gurevich |
| 5,374,590 A | 12/1994 | Batdorf et al. |
| 5,382,384 A | 1/1995 | Baigrie et al. |
| 5,384,190 A | 1/1995 | Kaburaki |
| 5,393,597 A | 2/1995 | Childers et al. |
| 5,399,295 A | 3/1995 | Gamble et al. |
| 5,407,872 A | 4/1995 | Komori et al. |
| 5,412,865 A | 5/1995 | Takaoka et al. |
| 5,416,662 A | 5/1995 | Kurasawa et al. |
| 5,438,166 A | 8/1995 | Carey et al. |
| 5,476,714 A | 12/1995 | Hyatt |
| 5,508,224 A | 4/1996 | Jang |
| 5,510,947 A | 4/1996 | Pellegrini et al. |
| 5,537,108 A | 7/1996 | Nathan et al. |
| 5,543,705 A | 8/1996 | Uezono et al. |
| 5,545,910 A | 8/1996 | Jang |
| 5,592,016 A | 1/1997 | Go et al. |
| 5,610,436 A | 3/1997 | Sponaugle et al. |
| 5,646,434 A | 7/1997 | Chrysostomides et al. |
| 5,669,381 A | 9/1997 | Hyatt |
| 5,707,886 A | 1/1998 | Consiglio et al. |
| 5,742,223 A | 4/1998 | Simendinger, III et al. |
| 5,747,147 A | 5/1998 | Wartenberg et al. |
| 5,756,007 A | 5/1998 | Franey |
| 5,763,320 A | 6/1998 | Stevens et al. |
| 5,777,368 A | 7/1998 | Wu et al. |
| 5,781,395 A | 7/1998 | Hyatt |
| 5,796,570 A | 8/1998 | Medkharasarn et al. |
| 5,801,612 A | 9/1998 | Chandler et al. |

| | | | | | | |
|---|---|---|---|---|---|---|
| 5,807,509 | A | 9/1998 | Shrier et al. | GB | 1449261 A | 9/1976 |
| 5,849,129 | A | 12/1998 | Hogge et al. | JP | 05-33707 | 12/1972 |
| 5,852,397 | A | 12/1998 | Chan et al. | JP | 53-104339 | 8/1978 |
| 5,864,281 | A | 1/1999 | Zhang et al. | JP | 58-081264 | 5/1983 |
| 5,874,885 | A | 2/1999 | Chandler et al. | JP | 58-081265 | 5/1983 |
| 5,889,308 | A | 3/1999 | Hong et al. | JP | 58-162877 | 9/1983 |
| 5,958,537 | A | 9/1999 | Akhter | JP | 58-162878 | 9/1983 |
| 5,970,321 | A | 10/1999 | Hively | JP | 60-196901 | 10/1985 |
| 5,976,645 | A | 11/1999 | Daluise et al. | JP | 62-279418 | 4/1987 |
| 5,985,173 | A | 11/1999 | Gray et al. | JP | 62-279419 | 4/1987 |
| 6,015,872 | A | 1/2000 | Kawakita et al. | JP | 62-181347 | 8/1987 |
| 6,087,923 | A | 7/2000 | Ahn et al. | JP | 63-043701 | 2/1988 |
| 6,104,274 | A | 8/2000 | Matsuda et al. | JP | 63-085864 | 4/1988 |
| 6,108,184 | A * | 8/2000 | Minervini et al. ............ 361/111 | JP | 01-104334 | 4/1989 |
| 6,130,459 | A | 10/2000 | Intrater | JP | 02-109226 | 4/1990 |
| 6,153,831 | A | 11/2000 | Weber et al. | JP | 03-221613 | 9/1991 |
| 6,191,928 | B1 | 2/2001 | Rector et al. | JP | 03-271330 | 12/1991 |
| 6,239,687 | B1 | 5/2001 | Shrier et al. | JP | 04-033230 | 2/1992 |
| 6,242,078 | B1 | 6/2001 | Pommer et al. | JP | 4242036 | 8/1992 |
| 6,251,513 | B1 | 6/2001 | Rector et al. | JP | 04-245129 | 9/1992 |
| 6,263,937 | B1 | 7/2001 | Barnes | JP | 04-245132 | 9/1992 |
| 6,310,752 | B1 | 10/2001 | Shrier et al. | JP | 04-255627 | 9/1992 |
| 6,351,011 | B1 | 2/2002 | Whitney et al. | JP | 05-166454 | 7/1993 |
| 6,357,890 | B1 | 3/2002 | Parsons et al. | JP | 52-62680 | 10/1993 |
| 6,472,972 | B1 | 10/2002 | Ishida | JP | 05-314888 | 11/1993 |
| 6,611,192 | B1 | 8/2003 | Kamoshida et al. | JP | 06-103880 | 4/1994 |
| 6,642,297 | B1 | 11/2003 | Hyatt et al. | JP | 06-298148 | 10/1994 |
| 6,943,302 | B2 | 9/2005 | Kageyama et al. | JP | 07-161503 | 6/1995 |
| 7,049,926 | B2 | 5/2006 | Shrier et al. | JP | 02-199302 | 7/1997 |
| 2003/0067730 | A1* | 4/2003 | Anthony et al. ............. 361/118 | JP | 2000-200869 | 7/2000 |
| 2003/0124784 | A1 | 7/2003 | Nakamura et al. | JP | 04-248221 | 9/2002 |
| 2005/0057867 | A1* | 3/2005 | Harris et al. .................. 361/56 | WO | WO 83/01153 | 3/1983 |

FOREIGN PATENT DOCUMENTS

| | | |
|---|---|---|
| CH | 663 491 A5 | 12/1987 |
| DE | 1803554 A1 | 5/1969 |
| DE | 3728489 A1 | 8/1987 |
| EP | 0 169 059 A2 | 1/1986 |
| EP | 0 229 286 A1 | 7/1987 |
| EP | 0 270 954 A1 | 6/1988 |
| EP | 0 301 533 A2 | 7/1988 |
| EP | 0 453 217 A1 | 4/1991 |
| EP | 0 460 790 A1 | 12/1991 |
| EP | 0 581 428 A1 | 2/1994 |
| EP | 0 588 136 A2 | 3/1994 |
| EP | 0 625 808 A1 | 11/1994 |
| EP | 0 649 150 B1 | 4/1995 |
| EP | 0 827 160 A1 | 3/1998 |
| GB | 1172718 A | 12/1969 |
| WO | WO 90/00305 | 11/1990 |
| WO | WO 93/14511 | 7/1993 |
| WO | WO 94/01876 | 1/1994 |
| WO | WO 94/25966 | 11/1994 |
| WO | WO 95/33276 | 12/1995 |
| WO | WO 95/33278 | 12/1995 |
| WO | WO 95/34084 | 12/1995 |
| WO | WO96/02922 A2 | 2/1996 |
| WO | WO96/02924 A1 | 2/1996 |
| WO | WO 96/41355 | 12/1996 |
| WO | WO96/41356 | 12/1996 |
| WO | WO 97/21230 | 6/1997 |
| WO | WO 98/34084 | 8/1998 |
| WO | WO 99/24992 | 5/1999 |
| WO | WO00/51152 A1 | 8/2000 |

* cited by examiner

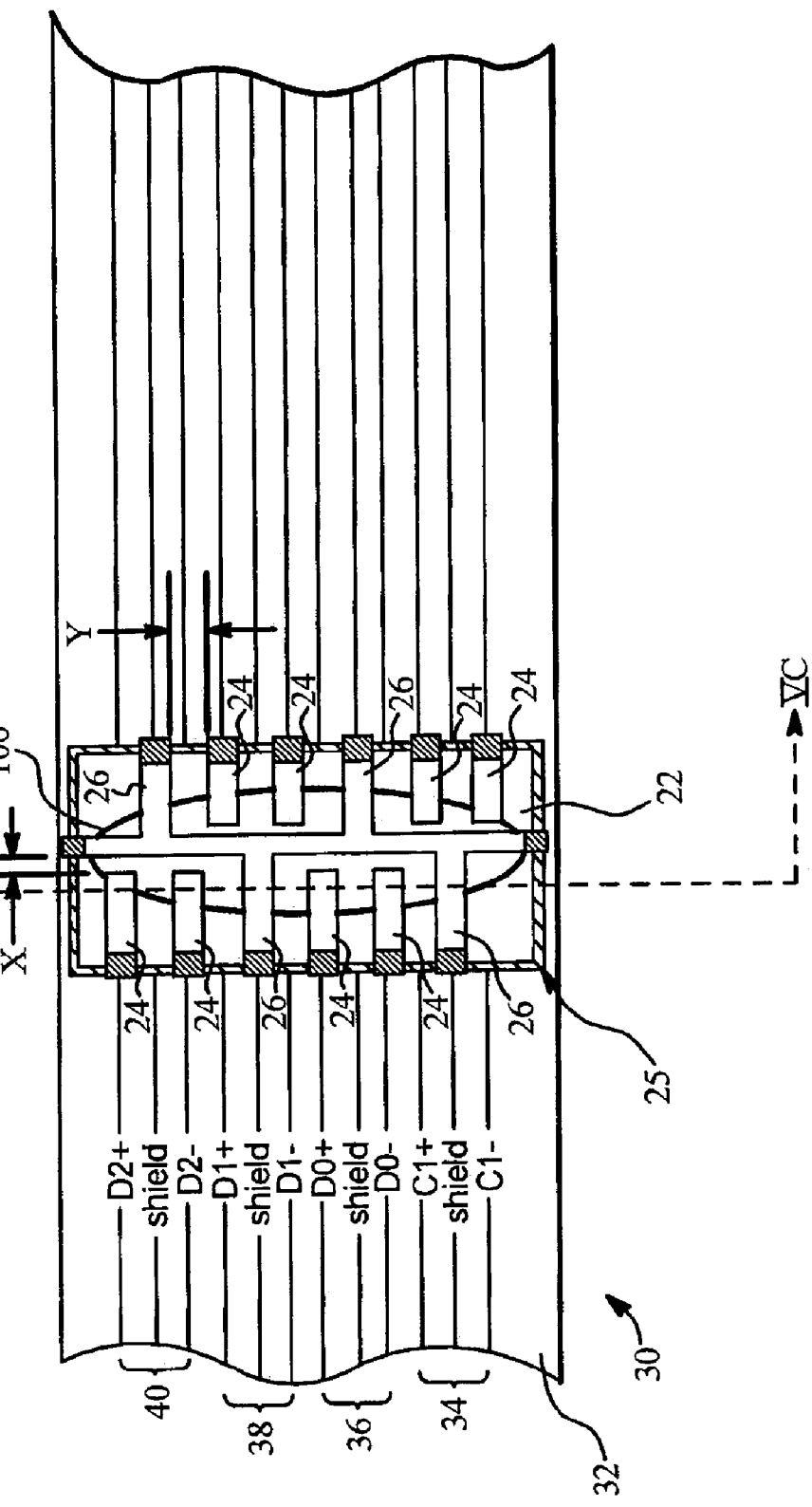

FLEXIBLE CIRCUIT HAVING OVERVOLTAGE PROTECTION

PRIORITY CLAIM

This application claims the benefit as a divisional of U.S. Pat. No. 10/958,442, filed Oct. 5, 2004, entitled "Direct Application Variable Material, Devices Employing Same and Methods of Manufacturing Such Devices," which claims the benefit as a continuation-in-part of U.S. patent application Ser. No. 10/746,020, filed Dec. 23, 2003, entitled "Direct Application Voltage Variable Material, Components Thereof And Devices Employing Same," which claims the benefit as a continuation-in-part of U.S. patent application Ser. No. 10/410,393, filed Apr. 8, 2003, entitled "Voltage Variable Material For Direct Application And Devices Employing Same," which claims the benefit of U.S. Provisional Patent Application No. 60/370,975, filed Apr. 8, 2002, entitled "Voltage Variable Material For Direct Application And Devices Employing Same," the entire contents of each which are hereby incorporated by reference and relied upon.

CROSS-REFERENCE TO RELATED APPLICATIONS

This application is related to the following commonly-owned co-pending patent applications: "Voltage Variable Substrate Material", Ser. No. 09/976,964, filed Oct. 11, 2005, and "Electrostatic Discharge Protection for Embedded Components", Ser. No. 11/032,442, filed Jan. 10, 2005.

BACKGROUND OF THE INVENTION

The present invention generally relates to circuit protection. More specifically, the present invention relates to voltage variable materials.

Electrical overstress ("EOS") transients produce high electric fields and usually high peak power that can render circuits or the highly sensitive electrical components in the circuits, temporarily or permanently non-functional. EOS transients can include transient voltages capable of interrupting circuit operation or destroying the circuit outright. EOS transients may arise, for example, from an electromagnetic pulse, an electrostatic discharge, lightning, a build-up of static electricity or be induced by the operation of other electronic or electrical components. An EOS transient can rise to its maximum amplitude in subnanosecond to microsecond times and have repeating amplitude peaks.

Materials exist for the protection against EOS transients, which are designed to respond very rapidly (ideally before the transient wave reaches its peak) to reduce the transmitted voltage to a much lower value for the duration of the EOS transient. EOS materials are characterized by high electrical resistance values at low or normal operating voltages. In response to an EOS transient, the materials switch very rapidly to a low electrical resistance state. When the EOS transient dissipates, these materials return to their high resistance state. EOS materials also recover very rapidly to their original high resistance value upon dissipation of the EOS transient.

EOS materials are capable of repeated switching between the high and low resistance states. EOS materials can withstand thousands of ESD events and recover to desired off-status after providing protection from each of the individual ESD events.

Circuits employing EOS materials can shunt a portion of the excessive voltage or current due to the EOS transient to ground, protecting the electrical circuit and its components. Another portion of the threat transient reflects back towards the source of the threat. The reflected wave is attenuated by the source, radiated away, or re-directed back to the surge protection device, which responds in kind to each return pulse until the threat energy is reduced to safe levels. A typical circuit employing an EOS transient device is illustrated in FIG. 1.

With reference to FIG. 1, a typical electrical circuit 10 is illustrated. The circuit load 12 in the circuit 10 operates at a normal operating voltage. An EOS transient of substantially more than two to three times the normal operating voltage having a sufficient duration can damage the load 12 and the components contained therein. Typically, EOS threats can exceed the normal operating voltage by tens, hundreds or even thousands of times the voltages seen in normal operation.

In the circuit 10, an EOS transient voltage 14 is shown entering the circuit 10 along line 16. Upon the occurrence of the EOS transient voltage 14, an EOS protection device 18 switches from the high resistance state to a low resistance state thus clamping the EOS transient voltage 14 at a safe, low value. The EOS protection device 18 shunts a portion of the transient threat from the electronic line 16 to the system ground 20. As stated above, the EOS protection device 18 reflects a large portion of the threat back towards the source of the threat.

EOS protection devices typically employ a voltage variable material ("VVM"). VVM's have typically been of a consistency and make-up requiring some form of housing or encapsulation. That is, the VVM materials have heretofore been provided in a device, such as a surface mount device, mounted to a printed circuit board ("PCB"). The VVM devices have typically been mounted discretely from the devices of the circuit that require protection. This presents a variety of problems.

First, VVM devices add to the number of components that are required to be mounted to the PCB. The VVM devices consume valuable board space and add to the potential for defects. The VVM devices typically require that additional pads be secured to the PCB and that additional circuit traces be routed from the PCB devices or from a ground plane to the VVM pads. It is always desirable for cost, spacing/flexibility and reliability purposes, to reduce the number of components mounted to a PCB.

Second, adding components to an existing PCB can require a board redesign or other type of incorporation into a currently pending design. If the application is already in production, it is likely that a considerable amount of time has been spent optimizing board space, which may or may not leave room to integrate a VVM device.

Third, many EOS transients occur outside of the PCB and are transmitted to the PCB through cables and wires. For instance, networked computer and telephone systems are subject to a variety of transients caused by environmental and handling activities. In these situations, it would be desirable to eliminate voltage transients before they reach the PCB.

SUMMARY OF THE INVENTION

The present invention provides overvoltage circuit protection. Specifically, the present invention provides a voltage variable material ("VVM") that includes an insulative binder that in one embodiment is formulated to intrinsically adhere to conductive and non-conductive surfaces. The binder and thus the VVM is self-curable and may be applied to an application in the form of an ink, which dries in a final form for use. The binder eliminates the need to place the VVM in a separate device and for separate printed circuit board pads on which to electrically connect the VVM. The binder and thus the VVM can be directly applied to many different types of substrates, such as a rigid FR-4 laminate, a polyimide, a polymer, glass and ceramic. The VVM can also be applied directly to different types of substrates that are placed inside a piece of electrical equipment (e.g., a connector).

The binder of the VVM includes a polymer, such as polyester, which is dissolved in a solvent. One suitable solvent for dissolving the polymer is diethylene glycol monoethyl ether acetate, referred to as "carbitol acetate." In an embodiment, a thickening agent, such as a fumed silica, is added to the insulative binder, which increases the viscosity of the insulative binder. A number of different types of particles are then mixed in the binder to produce a desired clamping voltage and response time. The different types of particles include: conductive particles (including core and shell conductive particles), insulating particles, semiconductive particles, doped semiconductive particles (including core and shell doped semiconductive particles) and any combination thereof.

The conductive particles in an embodiment include an inner core and an outer shell. The core and the shell have different conductivities or resistivities. Either the shell is more conductive than the core or the core is more conductive than the shell. The core and shell can each individually be of any of the different types of particles listed above. In one embodiment, the conductive particles include an aluminum core and an aluminum oxide shell. In another embodiment, the conductive particles include a copper core and a copper oxide shell. In an alternative embodiment, the conductive particles do not include a shell or coating. Here, conductive particles can consist substantially of a single material.

In one preferred embodiment, the VVM includes conductive particles and doped semiconductive particles. The conductive particles can be substantially pure nickel particles, while the doped semiconductive particles include doped silicon. Another preferred VVM of the present invention includes one or more types of conductive particles mixed in an insulating binder. In one embodiment, core-shell conductive particles are combined with a substantially pure conductive particle in the insulative binder. The pure conductive particle can be agglomerated or formed from multiple smaller particles to produce an overall larger particle, such as an agglomerated tungsten particle. The core-shell conductive particles in one embodiment include an aluminum or copper core and an insulative oxide shell. In another embodiment, a single type of conductive core-shell particle is placed in the binder. In a further alternative embodiment, core-shell semiconductive particles are provided, e.g., with a silicon core and an insulative shell, such as a silicon dioxide, epitaxial silicon or glass shell. The different formulations provide VVM's having different clamping voltages.

The VVM having the binder of the present invention can be applied to a substrate to form various circuits or applications. In a first application, a plurality of electrodes or conductors are secured to a printed circuit board via any known technique. The electrodes are each separated on the printed circuit board by a gap. The VVM is applied to and intrinsically adheres to the electrodes and the substrate in the gap. In a second application, the electrodes are again secured to the substrate, but the VVM only intrinsically adheres to the electrodes. That is, the VVM does not adhere to the substrate but is placed across the gap.

In a third application, the VVM intrinsically adheres to a substrate, wherein the electrodes are placed on and intrinsically adhere to the VVM. That is, the VVM secures the electrodes to the substrate. In a forth application, at least one of a plurality of electrodes is secured to the substrate, wherein the VVM intrinsically adheres to the secured electrode. At least one other electrode resides on top of the VVM. The gap between the electrodes is formed by the thickness of the VVM. Here, the VVM may or may not additionally, intrinsically secure to the substrate. The electrode that resides on top of the VVM can also have a portion that secures to the substrate.

When the VVM is applied to a circuit, such as on a printed circuit board, the quantity of VVM self-cures in a finished form that does not require a separate protective covering. The VVM may be left open to the environment through manufacture, shipping and use. The substrate can be any type of substrate, such as a rigid laminate (e.g., FR-4) used with printed circuit boards, a material such as a polyimide used with flexible circuits (e.g., Kaptong®), a polymer, ceramic or glass as well as any combination of these.

In another embodiment, the substrate can be coated or otherwise protected. For example, any of the applications described above can be covered with a coating. The coating can be any one of a variety of different materials including: a dry film photo-imageable coverlay, a spray liquid photo-imageable coverlay or a "glob-top" type coating as it is known in the art. Alternatively, any of the applications described above can be embedded in a multilayered printed circuit board ("PCB"). In another embodiment, at least one additional electrode or conductor secures to an underside of an upper substrate, wherein the VVM exists between the upper and lower substrates and intrinsically adheres to at least the upper and lower electrodes and possibly to one or more of the upper and lower substrates.

The circuit may or may not be provided in a device. For example, the device in an embodiment is a telecommunications device, such as an RJ-45 or RJ-11 connector. In another embodiment, the device is an input/output connector, such as a Deutsches Institut für Normung eV ("DIN") connector or ribbon cable connector. In each of these devices, the VVM protects one or more signal lines from transient voltage spikes by connecting the signal conductors to a ground conductor or shield.

In one embodiment, an RJ type connector includes a plurality of signal conductors. The connector also includes a grounded conductive shield. The shield is cut or stamped to yield at least one tab that is biased downwards towards the conductors. In one embodiment, the shield defines a separate tab for each of the conductors. The connector includes a housing that compresses the tabs onto the conductors. VVM is applied between the shield tabs and the conductors to provide overvoltage protection to the RJ connector. In an embodiment, the VVM is the intrinsically securing VVM described above, however, a known VVM provided in a device could also be used. In another embodiment, a capacitor is placed between the VVM and one of the conductors and the shield tab to block high DC voltages, such as those imposed during high potential [HI-POT] testing.

The present invention also includes multiple embodiments for providing a multilayer printed circuit board having VVM protection on one or more layers. In one embodiment, the VVM is screen-printed, stencil-printed or applied directly via a dispenser, e.g., from a pick and place machine, into a gap between electrodes on a layer of the PCB so that the VVM is substantially flush with the tops of the electrodes. The VVM therefore contacts the sides or edges but not the tops (substantially) of the electrodes. That efficient use of VVM enables an insulating layer to be applied to the electrodes and the VVM areas, so that further electrodes and VVM areas can be applied to the second insulating layer and so on. In an alternative embodiment, the VVM extends above the thickness of the electrodes slightly or more than slightly. Here, the VVM can contact the tops of the electrodes to a greater degree.

The multilayer PCBs can include different types of insulating materials, such as FR-4, ceramic, epoxy resin, resin coated foil, teflon, polyimide and glass. In an alternative embodiment, the WM is dispensed directly from a dispenser into the gaps defined between electrodes. The dispenser is pressurized, e.g., mechanically or pneumatically. The WM in one embodiment is made to have the consistency of an ink, wherein the dispenser is an atomizer that sprays the VVM between the gaps as desired.

The VVM of the present invention is also well suited to protect new digital cables or circuits, such as high-definition, multimedia interface ("HDMI") circuits, cables and connectors. The HDMI circuits can be protected in a planer X-Y type of application or via a Z directional structure described below.

It is therefore an advantage of the present invention to provide an intrinsically adhesive VVM.

Another advantage of the present invention is to provide a VVM that does not need to be housed in a separate device.

A further advantage of the present invention is to provide a VVM that is self-curing.

Yet another advantage of the present invention is to provide a VVM that adheres directly to a printed circuit board without the need for providing separate electrical pads on the substrate on which to mount the VVM.

Yet a further advantage of the present invention is to provide a VVM that adheres directly to a polymer or plastic.

Still another advantage of the present invention is to apply a VVM to a substrate directly, wherein the substrate is provided in an electrical device, such as a piece of equipment or a connector.

Still a further advantage of the present invention is to provide RJ type connectors having overvoltage protection.

Moreover, an advantage of the present invention is to provide input/output connectors having overvoltage protection.

Further still, an advantage of the present invention is to provide an apparatus for electrically connecting VVM (and alternatively, additionally a capacitor) to a plurality of different signal lines in an RJ type connector.

Moreover, an advantage of the present invention is, via the elimination of the need for a housing, to provide a lower cost, readily produced circuit protection material that can result in improved electrical performance due to the reduction of parasitic impedance.

Still a further advantage of the present invention is to provide different types of VVM's and different types of particles used in the VVM's, which can formulated to provide a desired, e.g., relatively low or high, clamping voltage.

Additional features and advantages of the present invention will be described in, and apparent from, the following Detailed Description of the Preferred Embodiments and the Drawings.

BRIEF DESCRIPTION OF THE DRAWINGS

FIG. 5B is top view of one embodiment for a high-definition multimedia interface ("HDMI") circuit that is protected with a device containing the VVM of the present invention.

DETAILED DESCRIPTION OF THE INVENTION

Figure 1:
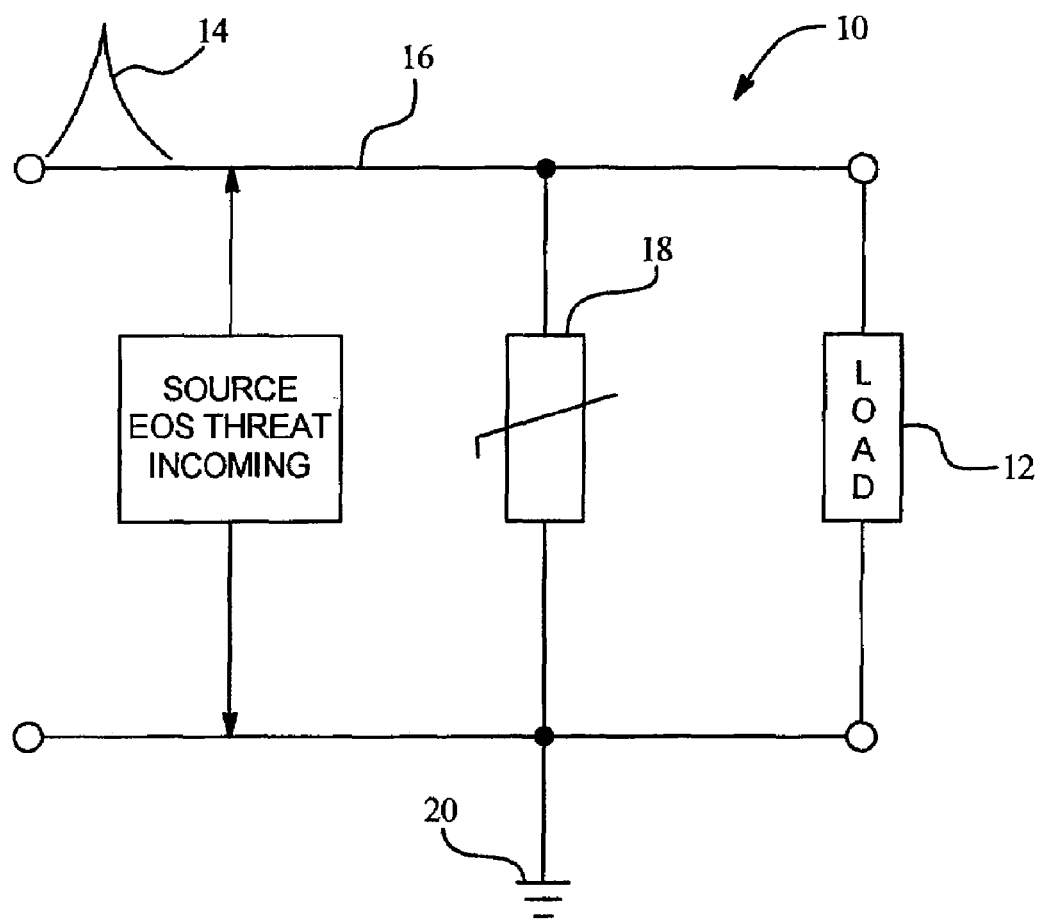
FIG. 1 is a schematic illustration of a typical waveform of an electrical overstress transient.
Figure 2:
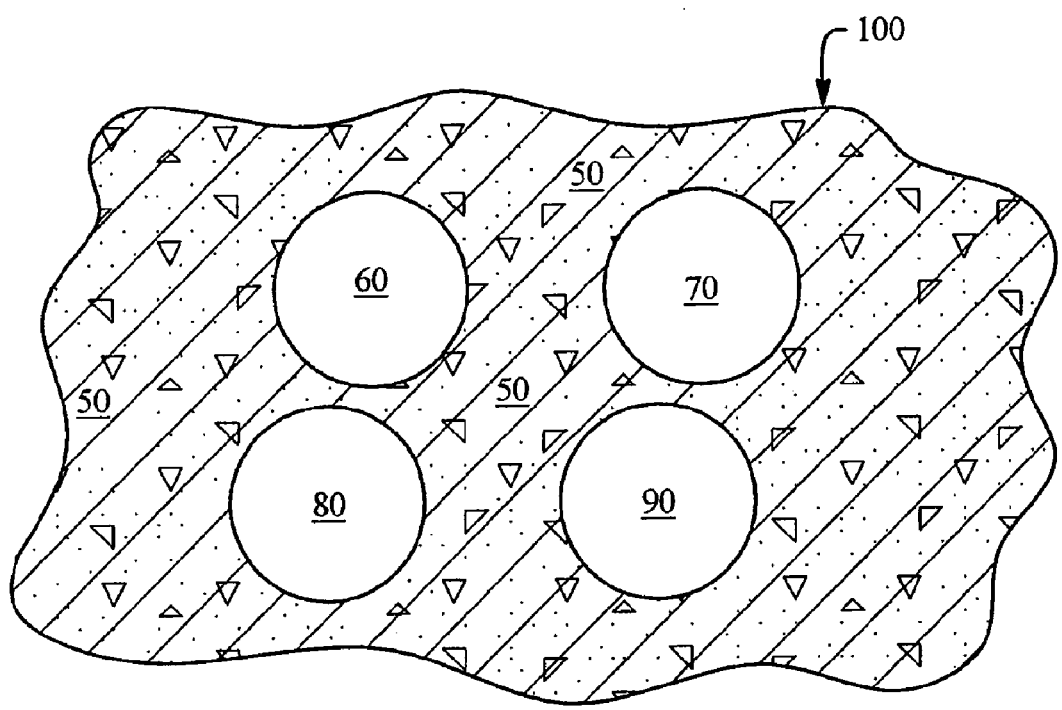
FIG. 2 is a schematic illustration of certain possible components for the voltage variable material ("VVM") of the present invention.

Referring now to FIG. 2, a voltage variable material ("VVM") 100 of the present invention includes an insulative binder 50. The binder 50 secures one or more or all of certain different types of particles, such as insulating particles 60, semiconductive particles 70, doped semiconductive particles 80, conductive particles 90 and various combinations of these. The insulative binder 50 has intrinsically adhesive properties and self-adheres to surfaces, such as a conductive, metal surface or a non-conductive, insulative surface. The insulative binder 50 has a property of being self-curing, so that the VVM 100 can be applied to a circuit or application and be used thereafter without heating or otherwise curing the VVM 100 and the insulative binder 50. It should be appreciated, however, that the circuit or application employing the VVM 100 with the binder 50 may be heated or cured to accelerate the curing process.

Insulative Binder

The insulative binder 50 of the VVM 100 in an embodiment includes a polymer or thermoplastic resin, such as polyester, which is dissolved in a solvent. In one embodiment, the polyester resin has a glass transition temperature in the range of 6° C. to 80° C. and a molecular weight between 15,000 and 23,000 atomic mass units ("AMU's"). One suitable solvent for dissolving the polymer is diethylene glycol monoethyl ether acetate, referred to as "carbitol acetate." In an embodiment, a thickening agent is added to the insulative binder 50, which increases the viscosity of the insulative binder 50. For example, the thickening agent can be a fumed silica, such as that found under the trade name Cab-o-Sil TS-720.

The insulative binder 50 in an embodiment has a high dielectric breakdown strength, a high electrical resistivity and high tracking resistance. The insulative binder 50 provides and maintains sufficient interparticle spacing between the other possible components of VVM 100, such as the conductive particles 90, the insulating particles 60, the semiconductive particles 70 and the doped semiconductive particles 80. The interparticle spacing provides a high resistance. The resistivity and dielectric strength of the insulative binder 50 also affects the high resistance state. In an embodiment, the insulative binder 50 has a volume resistivity of at least $10^9$ ohm-cm. It is possible to blend different polymers in the binder 50 and to cross-link same.

Insulative binder 50 in one embodiment is intrinsically adhesive. When VVM 100 employs the intrinsically adhesive insulative binder 50, the VVM may be self-cured or self-secured to conductive and insulative materials. The intrinsically adhesive insulative binder 50 adheres and cures to any type of electrical lead, coil, electrode, pin, trace, etc. The intrinsically adhesive insulative binder 50 adheres and cures to any type of insulative material, laminate or substrate. For example, the intrinsically adhesive insulative binder 50 adheres and cures to any type of printed circuit board material, flexible circuit material, polymer, glass and ceramic.

In one embodiment, the intrinsically adhesive insulative binder 50 of the VVM 100 adheres and cures to a known FR-4 laminate. The FR-4 laminate typically includes a woven or non-woven fabric, which is meshed or perforated. The intrinsically adhesive binder 50 of the VVM 100 may also adhere to a FR-4 layer of a multilayer PCB. In another embodiment, the intrinsically adhesive insulative binder 50 of the VVM 100 adheres and cures to a polyimide material. One type of polyimide material to which the insulative binder 50 intrinsically secures is manufactured by Dupont Corporation and is called "Kapton." There are three variants of the Kapton® material. One Kaptong® material includes an acrylic base adhesive but is not flame retardant. Another Kapton® material includes an acrylic base adhesive and is flame retardant. A third Kapton® material is not adhesive. The insulative binder 50 of the VVM 100 can adhere and cure to each of the variants.

The insulative intrinsically adhesive binder 50 of the VVM 100 can further adhere to a rigid-flexible material. As its name implies, the rigid-flexible material is a composite of two different materials, one flexible (such as Pyralux), and the other rigid FR-4. This type of material is especially useful for any application that requires connection to moving or bending parts and also requires a stable platform for components.

It should be appreciated that the insulative binder 50 for the compositions described below does not have to be intrinsically adhesive or self-curing. Further, in one embodiment, binder 50 includes silicone.

Insulating Particles

In an embodiment, insulating particles 60 are dispersed into the binder 50 of the VVM 100. The insulating particles 60 in an embodiment have an average particle size in a range of about 200 to about 1000 Angstroms ("Å") and a bulk conductivity of less than $10^{-6}$ (ohm-cm)$^{-1}$. In one embodiment, the insulating particles 60 have an average particle size in a range of about 50 Å to about 200 Å.

The fumed silica of the insulating binder 50, such as that available under the trade name Cab-o-Sil TS-720, constitutes an insulating particle 60. Other insulative particles, however, can be used in addition to the fumed silica. For example, glass spheres, calcium carbonate, calcium sulfate, barium sulfate, aluminum trihydrate, kaolin and kaolinite, ultra high-density polyethylene ("UHDPE") and metal oxides such as titanium dioxide may also be used as insulating particles 60 in the present invention. For example, titanium dioxide having an average particle size from about 300 to 400 Å, manufactured by Nanophase Technologies, provides a suitable insulating particle 60.

The insulating particles 60 can also include oxides of iron, aluminum, zinc, titanium, copper and clay such as a montmorillonite type produced by Nanocor, Inc. Insulating particles 60 in addition to the fumed silica, if employed in the VVM 100, are present in an embodiment from about one to about fifteen percent by weight of the VVM 100.

Semiconductive Particles and Doped Semiconductive Particles

In an embodiment, semiconductive particles 70 are dispersed into the binder 50 of the VVM 100. The semiconductive particles 70 in an embodiment include an average particle size of less than 5 microns and bulk conductivities in the range of 10 to $10^{-6}$ (ohm-cm)$^{-1}$. In order to maximize particle packing density and obtain optimum clamping voltages and switching characteristics, the average particle size of the semiconductive particles 70 in one preferred embodiment is in a range of about 3 to about 5 microns, or even less than 1 micron. Semiconductive particle sizes down to the 100-nanometer range and less are also suitable for use in the present invention.

The material of the semiconductive particles 70 in an embodiment includes silicon carbide. The semiconductive particle materials can also include: oxides of bismuth, copper, zinc, calcium, vanadium, iron, magnesium, calcium and titanium; carbides of silicon, aluminum, chromium, titanium, molybdenum, beryllium, boron, tungsten and vanadium; sulfides of cadmium, zinc, lead, molybdenum, and silver; nitrides such as boron nitride, silicon nitride and aluminum nitride; barium titanate and iron titanate; suicides of molybdenum and chromium; and borides of chromium, molybdenum, niobium and tungsten.

In an embodiment, the semiconductive particles 70 include silicon carbide for example, manufactured by Agsco, which can be of #1200 grit and have an average particle size of approximately 3 microns. The silicon carbide can alternatively be manufactured by Norton, be of #10,000 grit, and have an average particle size of approximately 0.3 microns. In another embodiment, the semiconductive particles 70 include silicon carbide and/or at least one other material including: barium titanate, boron nitride, boron phosphide, cadmium phosphide, cadmium sulfide, gallium nitride, gallium phosphide, germanium, indium phosphide, magnesium oxide, silicon, zinc oxide, and zinc sulfide.

In an embodiment, doped semiconductive particles 80 are dispersed into the binder 50 of the VVM 100. The addition of certain impurities (dopants) affects the electrical conductivity of a semiconductor. The impurity or material used to dope the semiconductive material may be either an electron donor or an electron acceptor. In either case, the impurity occupies the energy level within the energy band gap of an otherwise pure semiconductor. By increasing or decreasing the impurity concentration in a doped semiconductor, the electrical conductivity of the material is varied. The electrical conductivity of a pure semiconductor may be extended upward (into the range of a semimetal or metal) by increasing the conduction electron concentration, or may be extended downward (into the range of an insulator) by decreasing the conduction electron concentration.

In one embodiment, the semiconductive particles 70 and doped semiconductive particles 80 are mixed into the insulative binder 50 of the VVM 100 via standard mixing techniques. In another embodiment, various different doped semiconductive particles 80 that have been doped to different electrical conductivities are dispersed into the insulative binder 50 of the VVM 100. Either of these embodiments can also include insulating particles 60.

In one embodiment, the VVM 100 employs a semiconductive particle doped with a material to render it electrically conductive. The doped semiconductive particles 80 may be comprised of any conventional semiconductive material including: boron nitride, boron phosphide, cadmium phosphide, cadmium sulfide, gallium nitride, gallium phosphide, germanium, indium phosphide, silicon, silicon carbide, zinc oxide, zinc sulfide as well as electrically conducting polymers, such as polypyrole or polyaniline. These materials are doped with suitable electron donors for example, phosphorous, arsenic, or antimony or electron acceptors, such as iron, aluminum, boron, or gallium, to achieve a desired level of electrical conductivity.

In an embodiment, the doped semiconductive particles 80 include a silicon powder doped with aluminum (approximately 0.5% by weight of the doped semiconductive particle 80) to render it electrically conductive. Such a material is marketed by Atlantic Equipment Engineers under the trade name Si-100-F. In another embodiment, the doped semiconductive particles include an antimony doped tin oxide marketed under the trade name Zelec 3010-XC.

In an embodiment, the doped semiconductive particles 80 of the VVM 100 have an average particle size less than 10 microns. In order to maximize particle-packing density and obtain optimum clamping voltages and switching characteristics, however, the average particle size of the semiconductive particles may be in a range of about 1 to about 5 microns, or even less than 1 micron.

One Preferred VVM Component

Figure 3A:
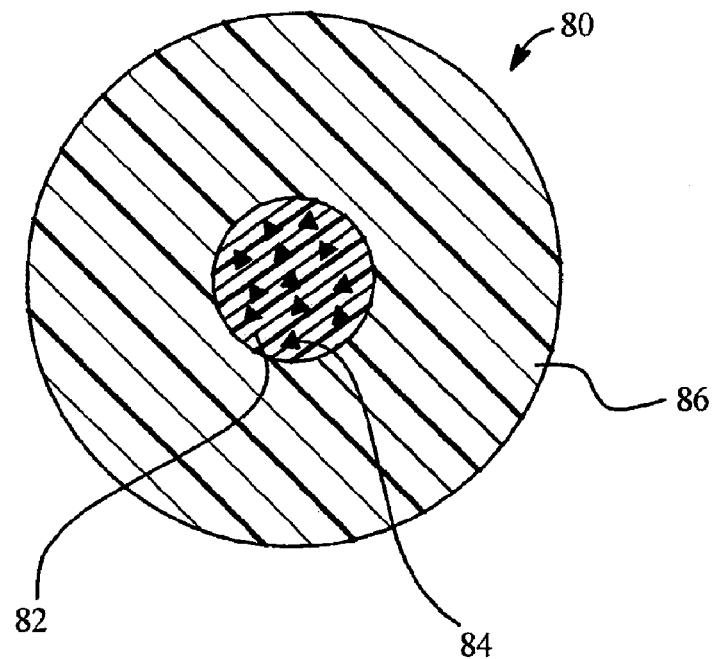
FIG. 3A is a sectional schematic illustration of a core and shell doped semiconductive particle used with the VVM of the present invention.

One preferred doped semiconductive particle 80 is illustrated in FIG. 3A. Semiconductive particle 80 includes an inner core 82 that is doped with at least one dopant 84. The inner core is then surrounded by an outer shell or coating 86. In one embodiment, the core material 82 includes particle or powdered silicon. The silicon 82 is doped to a low resistivity value (e.g., below 1 ohm-cm) and thereafter ground to a powder. The average size of the particles 82 is any suitable size and in one embodiment, the core particles are each between five and 100 microns. In one embodiment, the average thickness of the shell or coating is about 100 to about 10,000 Å.

The core material 82 or silicon is doped with a suitable dopant, such as antimony, arsenic, phosphorus, boron or any of the other dopants listed herein. Core material 82 can be any suitable semiconductive material, such as silicon carbide, germanium, gallium arsenide and the like. In one embodiment, only a single type of dopant is used. It should be appreciated, however, that different types of dopants could be used in the same particle.

The shell or coating 86 of doped semiconductive particle 80 can be made of a multitude of different materials. For example, the coatings can be any one of the following materials: silicon dioxide, epitaxial silicon or glass. Each of those materials is inert, so that they do not react with other components of the VVM of the present invention.

The type of coating or shell 86 dictates the process used for forming the coating or shell. For example, if the coating or shell 86 is an oxide, e.g., silicon dioxide, the layer is grown via heating at one or more temperatures over a specified or variable time in one embodiment. It has been found that suitable silicon oxide layers can be formed by subjecting the core doped silicon particles 82 to heat and temperature. In particular, the particles can be heated at a temperature of about 500° C. to about 1500° C. over an oxidation time from about 15 minutes to about three hours. The heating is performed over multiple intervals of heating and cooling. In one embodiment, the cooling is performed while subjecting the particles to a vacuum of about ten to 100 millitorr. Vacuum cooling is advantageous because it tends to prevent exposure of the VVM to moisture. The particles in one embodiment are heated for about thirty minutes and then vacuum cooled overnight. That process is then repeated.

Figure 16:
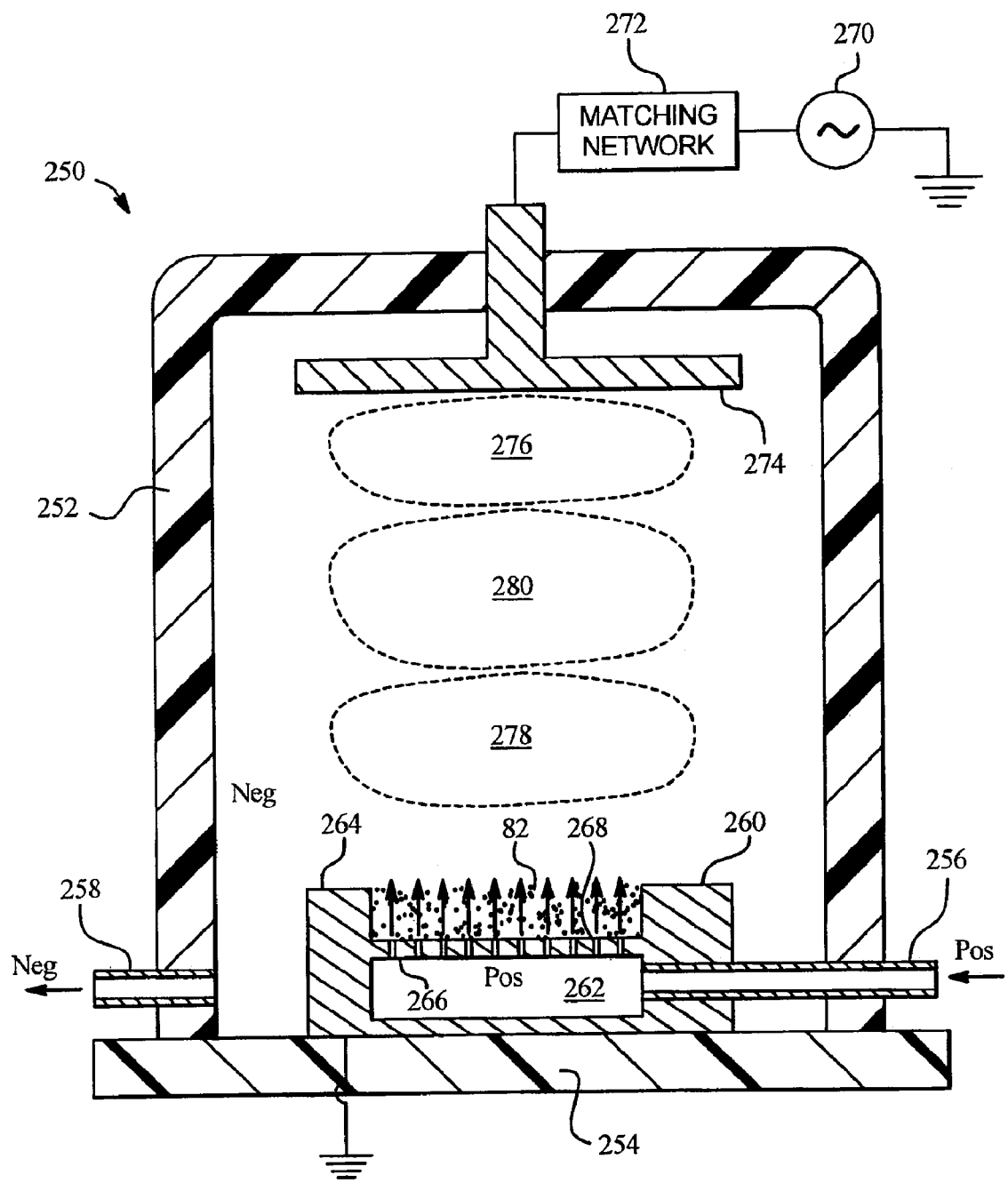
FIGS. 16 and 17 are schematic views of various fluidized bed plasma reactors of the present invention suitable for use to coat particles of the voltage variable materials described herein.
Figure 17:
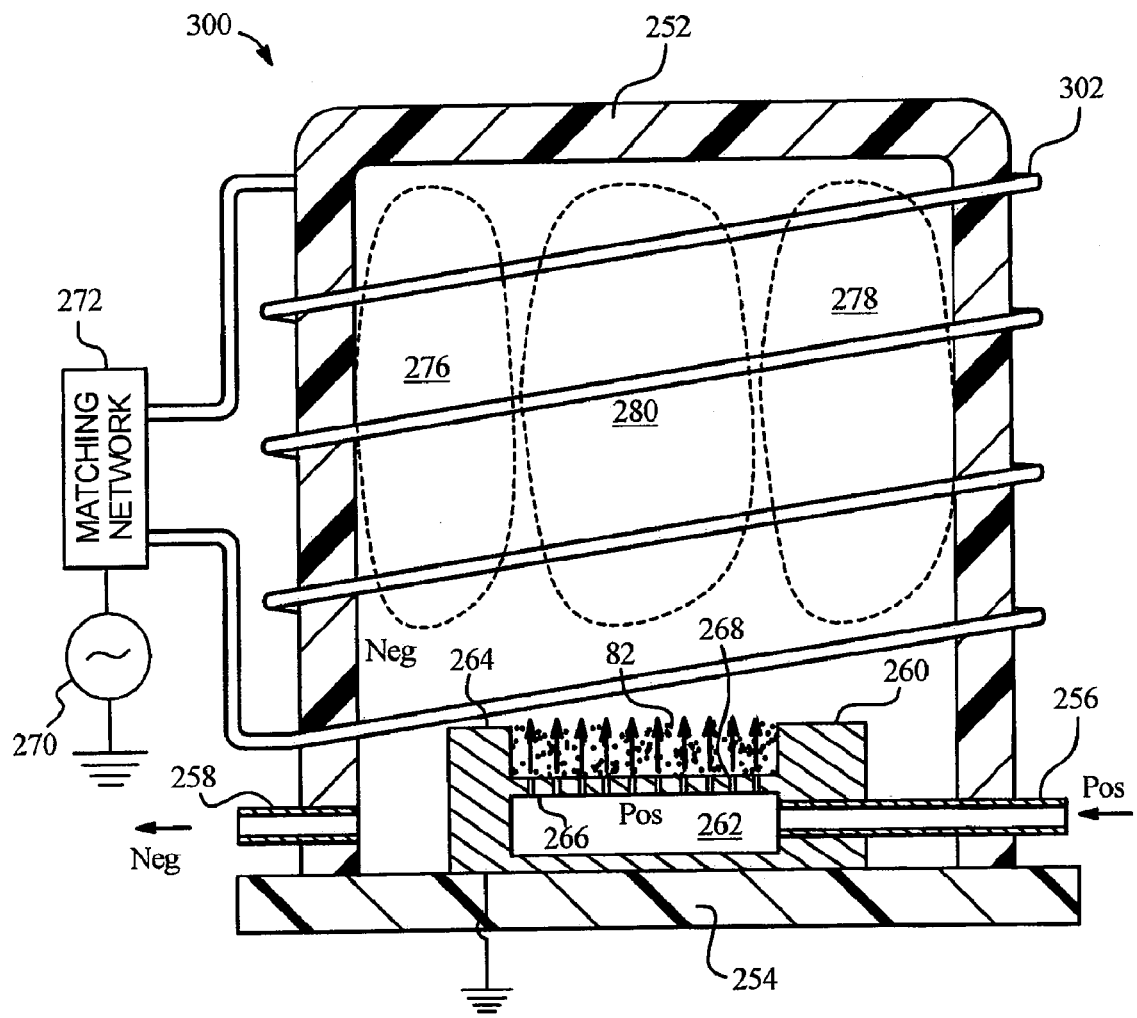

Referring now to FIGS. 16 and 17, another method and apparatus contemplated by the present invention for forming the coating 86 on the core particle 82 is illustrated by a fluidized bed plasma reactor 250 (FIG. 16) and a reactor 300 (FIG. 17). Fluidized bed reactor 250 is shown schematically for ease of illustration. Reactor 250 includes a housing 252 and base 254. Housing 252 and base 254 are made of an electrically insulative or dielectric material, such as glass or plastic, in one embodiment.

Housing 252 attaches to or defines an inlet pressure port 256 and an outlet vacuum port 258 as illustrated. Inlet pressure port 256 extends to a pressure chamber 260. Pressure chamber 260 defines or includes a pressure plenum 262. Pressure plenum 262 enables a reactant gas from port 256 to enter and stabilize under pressure within plenum 262. Reactant gas entering the inside of housing 252 through plenum 262 is removed under negative pressure from port 258 defined by or attached to housing 252.

Chamber 260 also defines or includes a bed 264 for holding core particles 82, such as doped core particles. The bottom wall 266 of bed 264 is also the top wall of plenum 262. Wall 266 defines perforated or sintered openings 268 that enable the pressurized reactant gas to escape through wall 266 in a relatively uniform, steady and consistent manner. If the pressure within plenum 262 is sufficient, the gas flow through particles 82 will cause the particles to become entrained in the gas. The particles are thereafter held in a liquid-like state, wherein the top of the suspension of particles 82 is relatively flat due to gravity, as would be the case if liquid were poured into bed 264. Energized conductor 274 in combination with grounded conductor 260 creates plasma sheeting regions 276 and 278, as well as a glow discharge region 280 located between plasma sheeting regions 276 and 278. Particles 82 suspended in the gas stream are thereby ensured to be mixed properly with the plasma glow discharge 280.

The reactant gas entering port 256 is carried via a carrier gas, such as nitrogen, argon, helium, carbon dioxide, oxygen, other gases and combinations thereof. The reactant gas can be any suitable plasma gas known to those of skill in the art, such as triethylaluminum ("TEAL"), carbon tetrachloride, Silane, Diborane and any combination thereof.

The reactor 250 is also coupled to a high frequency power supply 270 that operates through a matching network 272 to supply power to a pair of electrodes 274 and 260. Matching network 272 matches the impedances of the power supply and the reactor chamber to provide for an optimal transfer of energy to the chamber. It should be noted that pressure chamber 260, and in particular plate 266, function additionally as a second electrode in combination with electrode 274. Pressurized chamber 260 is therefore made of a conductive material.

Power supply 270 is a high frequency power supply and is an inductively coupled radio frequency ("RF") power supply in one embodiment. The high frequency energy from supply 270 excites the reactant gas molecules entering housing 252 through plenum wall 266, causing the molecules to become ionized. The fluidized bed continuously mixes the particles as described above with the ionized gas so that the reaction of the core particles is uniform.

In one embodiment, reactor 250 is used to provide the oxide layer on the doped core silicon 82 particles described above. The time that the doped core particles spend in the chamber, the amount and frequency of power supplied to the electrodes 274 and 260 and the gases selected all control the oxide growth rate and amount. It should be appreciated, however, that reactor 250 can be used to create other coatings or shells for particle 80 other than oxide shells. For example, the system could be used to apply different types of coatings with plasma-enhanced chemical vapor deposition ("PECVD").

It should be appreciated that while reactor 250 is used in one preferred embodiment to apply an oxide layer or other coating to doped semiconductive core 82, the apparatus and method can be used to apply coatings to other types of core materials, such as semiconductive core materials without dopants, insulative materials and conductive materials. Indeed, reactor 50 can be used to produce the core-shell conductive particle 90 described below in connection with FIG. 3B.

FIG. 17 illustrates an alternative reactor 300. Alternative reactor 300 includes many of the same components herein. The same functionality as described above for reactor 250. Those components are marked with the same element numbers. Reactor 300 includes an inductive coil 302 that is wrapped about housing 252. Energy from power supply 270 is inductively coupled to the reactor through coil 302. The dark or sheeting regions 276 and 278 occur along the sides of alternative reactor 300, and the glow discharge region 280 is located between plasma sheeting regions 276 and 278. Again, the gas stream entraining particles 82 ensures the proper mixing of the particles with the plasma glow discharge 280.

Each of the insulating particles 60, semiconductive particles 70 and doped semiconductive particles 80 are optionally dispersed into the binder 50 of the VVM 100. The fumed silica, or Cab-o-Sil, of the binder 50 constitutes an insulating particle 60. In a preferred embodiment, the VVM 100 includes conductive particles 90. The conductive particles 90 in an embodiment have bulk conductivities of greater than 10 (ohm-cm)-1 and especially greater than 100 (ohm-cm)-1. It is possible, however, that by using doped semiconductive particles the VVM 100 does not include conductive particles 90.

Conductive Particles

The conductive particles 90 in an embodiment have a maximum average particle size less than 60 microns. In an embodiment, ninety-five percent of the conductive particles 90 have diameters no larger than 20 microns. In another embodiment, one hundred percent the conductive particles 90 are less than 10 microns in diameter. In a further embodiment, conductive particles 90 with average particle sizes in the submicron range, for example one micron down to nanometers, are used.

Suitable materials for the conductive particles 90 of the VVM 100 include: aluminum, brass, carbon black, copper, graphite, gold, iron, nickel, silver, stainless steel, tin, zinc and alloys thereof as well as other metal alloys. In addition, intrinsically conducting polymer powders, such as polypyrrole or polyaniline may also be employed, as long as they exhibit stable electrical properties.

In an embodiment, the conductive particles 90 include nickel manufactured by Atlantic Equipment Engineering and marketed under the trade name Ni-120, which have an average particle size in the range of 10-30 microns. In another embodiment, the conductive particles 90 include aluminum and have an average particle size in the range of 1 to 30 microns.

Figure 3B:
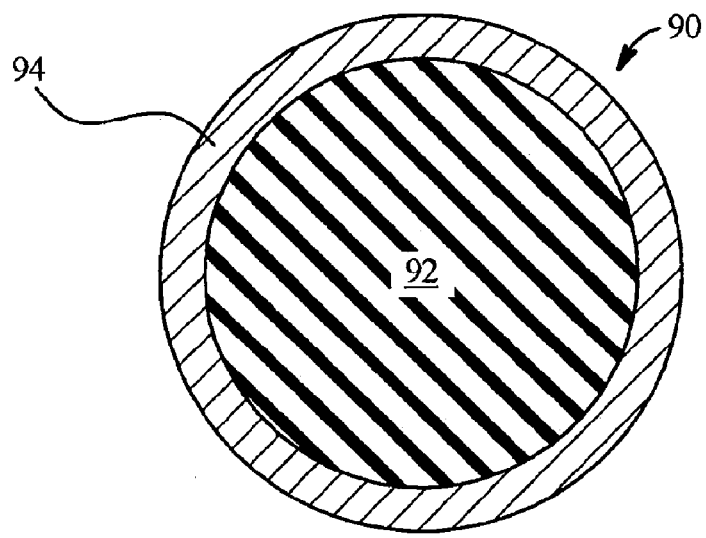
FIG. 3B is a sectional schematic illustration of a core and shell conductive particle of the VVM of the present invention.

The conductive particles 90 in one embodiment are not coated and consist essentially of a single material. Referring to FIG. 3B, in another embodiment, the conductive particles include an inner core 92 surrounded by an outer shell 94. The core 92 and the shell 94 of the particles 90 have different electrical conductivities. In an embodiment, the core and the shell particles 90 are substantially spherical in shape and range from about 25 to about 50 microns.

In one embodiment, the inner core 92 of the conductive particles 90 includes an electrically insulating material, wherein the outer shell 94 includes one of the following materials: (i) a conductor; (ii) a doped semiconductor; or (iii) a semiconductor. In another embodiment, the inner core 92 of the conductive particles 90 includes a semiconductive material, wherein the outer shell 94 includes one of the following materials: (i) a conductor; (ii) a doped semiconductor; or (iii) a semiconductive material other than the semiconductive material of the inner core. In a further embodiment, the inner core 92 includes a conductive material, wherein the outer shell 94 may be comprised of one of the following materials: (i) an insulating material; (ii) a semiconductor; (iii) a doped semiconductor; or (iv) a conductive material other than the conductive material of the inner core.

Conductive materials suitable for use in the conductive core-shell particles 90 include the following metals and alloys thereof: aluminum, copper, gold, nickel, palladium, platinum, silver, titanium and zinc. Carbon black may also be used as a conductive material in the VVM 100. The insulating materials 60, semiconductive particles 70 and doped semiconductive particles 80 described above may be mixed with the conductive core-shell particles 90 in the binder 50 of the VVM 100 of present invention.

In one embodiment, the core-shell particles 90 include an aluminum core 92 and an aluminum oxide shell 94. In another embodiment, the core-shell particles 90 include a copper core 92 and a copper oxide shell 94. The particles 90 having the aluminum or copper core 92 and the aluminum oxide or copper oxide shell 94 can then be provided in the intrinsically adhesive binder having formed silica with or without additional one or more of insulating particles 60, semiconductive particles 70 or doped semiconductive particles 80.

In another embodiment, the core-shell particles 90 include a titanium dioxide (insulator) core 92 and an antimony doped tin oxide (doped semiconductive) shell 94. These latter particles are marketed under the trade name Zelec 1410-T. Another suitable core-shell particle 90 is marketed under the trade name Zelec 1610-S and includes a hollow silica (insulator) core 92 and an antimony doped tin oxide (doped semiconductive) shell 94.

Particles having a fly ash (insulator) core 92 and a nickel (conductor) shell 94, and particles having a nickel (conductor) core 92 and silver (conductor) shell 94 are marketed by Novamet are also suitable for use in the present invention. Another suitable alternative is marketed under the trade name Vistamer Ti-9115 by Composite Particles, Inc. of Allentown, Pa. These conductive core-shell particles have an insulative shell 92 of ultra high-density polyethylene ("UHDPE") and a conductive core 94 material of titanium carbide ("TiC"). Also, particles 90 having a carbon black (conductor) core 92 and a polyaniline (doped semiconductive) shell 94 marketed by Martek Corporation under the trade name Eeonyx F-40-10DG may be used in the VVM 100 of the present invention.

VVM Formulations

In one embodiment of the VVM 100, the intrinsically adhesive insulative binder 50 constitutes from about 20 to about 60%, and more specifically from about 25 to about 50%, by weight of the total composition. The conductive particles 90 in an embodiment constitute from about 5 to about 80%, and more specifically from about 50 to about 70%, by weight of the total composition. These ranges apply whether or not VVM 100 includes additional insulative particles 60, semiconductive particles 70 and/or doped semiconductive particles 80. The semiconductive particles 70, if present, constitute from about 2 to about 60%, and more specifically from about 2 to about 10%, by weight of the total composition.

In another embodiment of the VVM 100, the intrinsically adhesive insulative binder 50 constitutes from about 30 to about 65%, and more specifically from about 35 to about 50%, by volume of the total composition. The doped semiconductive particles 80 constitute from about 10 to about 60%, and more specifically from about 15 to about 50%, by volume of the total composition. The semiconductive particles 70 constitute from about 5 to about 45%, and more specifically from about 10 to about 40%, by volume of the total composition. The insulating particles 60 comprise from about 1 to about 15%, and more specifically from about 2 to about 10%, by volume of the total composition.

The switching characteristics of the VVM 100 are determined by the nature of the insulating, semiconductive, doped semiconductive and conductive particles, the particle sizes and size distribution, and the interparticle spacing. The interparticle spacing depends upon the percent loading of the insulating, semiconductive, doped semiconductive and conductive particles and on their size and size distribution. In the compositions of the present invention, interparticle spacing will be generally greater than 1,000 Å.

Through the use of the VVM 100 employing the intrinsically adhesive insulative binder 50 and the other particles described above, compositions of the present invention generally can be tailored to provide a range of clamping voltages from about 30 volts to greater than 2,000 volts. Certain embodiments of the present invention for circuit board level protection exhibit clamping voltages in a range of 100 to 200 volts, more specifically less than 100 volts, still more specifically less than 50 volts, and especially exhibit clamping voltages in a range of about 25 to about 50 volts.

One Preferred VVM

The doped semiconductive core-shell particle 80 illustrated in FIG. 3A can be combined with many different types of particles to produce different voltage variable materials that suitably combat EOS transients. In one embodiment, the particles 80 of FIG. 3A are mixed in an insulative binder, such as binder 50 described above with any of the conductive particles 90 described herein. In one embodiment, conductive particles 90 include a substantially pure material, such as pure nickel, that is substantially not oxidized. It should be appreciated, however, that the particle 80 of FIG. 3A can be used with a core-shell-type conductive particle described above in connection with FIG. 3B. Further, particles 80 illustrated in connection with FIG. 3A can be combined with one or more of non-doped semiconductive particles 70, conductive particles 90 and insulative particles 60. In one embodiment, a nanotungsten powder is also added.

In one preferred embodiment, VVM 100 is formed using particles 80 described in connection with FIG. 3A in combination with nickel, wherein the doped semiconductive particles are provided in a concentration of about 40 to about 80% by volume, while the nickel particles are provided in a concentration of about 5 to about 25% by volume. The listed concentrations are the resulting concentrations after VVM 100 has been cured properly via the multiple heating and cooling steps discussed above. That is, the concentrations specify the VVM 100 as it is applied in an application.

Particles 80 and the nickel particles are mixed in an insulative binder 50, which is a polymer that is dissolved via carbitol acetate to have the direct application properties described herein. The resulting VVM 100 has a resistivity of about 1400 ohm-cm to about 14×106 ohm-cm.

Another Preferred VVM

In a second preferred embodiment, VVM 100 includes two different conductive particles that are mixed into an insulative binder 50. The second preferred embodiment uses the core-shell type conductive particles 90 described above in connection with FIG. 3B as well as conductive particles 90 that do not have a shell, e.g., that are substantially not oxidized. The core-shell conductive particles 90 and the non-oxidized or non-shell conductive particles 90 are mixed in an insulative binder 50, which is a polymer that is dissolved via carbitol acetate to have the direct application properties described herein.

In one implementation, the core-shell particles 90 of the second preferred embodiment of VVM 100 include an aluminum or copper core 92 and an aluminum oxide or copper oxide shell 94, although any of the core-shell particles 90 having a core 92 and a shell 94 can be used. The aluminum core 92 in one embodiment has an average size in the range of 0.1 to 30 microns. The aluminum oxide shell 94 in one embodiment has an average thickness on the order of nanometers. Copper core 92 and copper oxide shell 94 can have similar sizes.

Figure 3C:
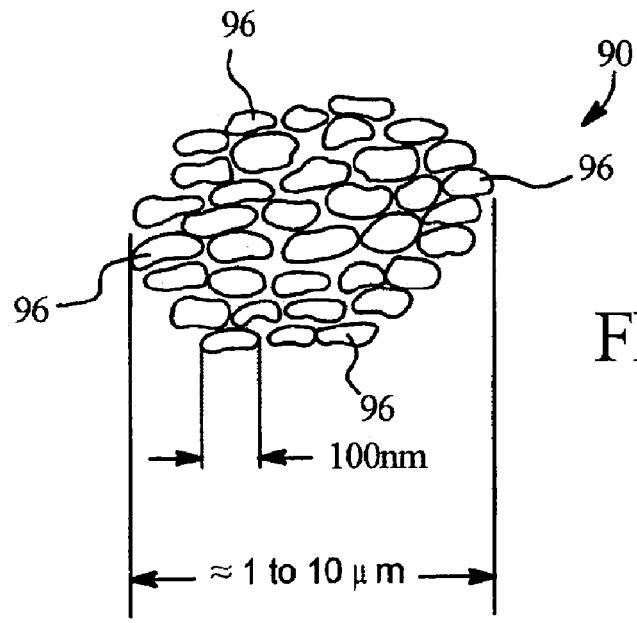
FIG. 3C is a sectional schematic illustration of an agglomerated conductive particle of the VVM of the present invention.

The non-oxidized or non-coated conductive particles 90 of the second preferred embodiment of VVM 100 can be any of the particles described above in connection with FIG. 2. In one implementation, as seen in FIG. 3C, the non-oxidized or non-coated conductive particles 90 are tungsten particles of about 1 to about 10 microns in average size. The tungsten particles can be round, elongated, elliptical or ovular and in one embodiment are agglomerated or formed from many smaller tungsten particles 96, e.g., having average size on the order of 100 nanometers. Alternatively, the tungsten particles 90 are solid and not agglomerated.

The resulting second preferred embodiment of VVM 100 has a resistivity of about 1400 ohm-cm to about 14×106 ohm-cm in one embodiment, although different resistivities could be achieved based at least on particle loading, particle concentration and particle sizing. In one embodiment, the core-shell conductive particles 90 are provided in a concentration of about 35% to about 80% by volume and in one implementation about 52.5% by volume. The non-coated conductive particles 90 are provided in a concentration of about 2% to about 30% by volume and in one implementation about 17.5% by volume. The remainder of the volume is consumed by the insulative binder 50, which can be made of any of the embodiments described above.

The second preferred VVM embodiment can but does not have to additionally include any one or more of the insulating particles 60, semiconductive particles 70 and doped semiconductive particles 80.

A Further Preferred VVM

In a third preferred embodiment, VVM 100 includes two different conductive particles 90 and semiconductive particles 70 that are mixed into an insulative binder 50. The third preferred embodiment uses the core-shell conductive particles 90 as well as non-oxidized or non-coated conductive particles 90 that do not have a shell, e.g., that are substantially not oxidized, as described above in connection with the second preferred embodiment. The insulative binder 50 is in one preferred implementation a polymer that is dissolved via carbitol acetate to have the direct application properties described herein.

Figure 3D:
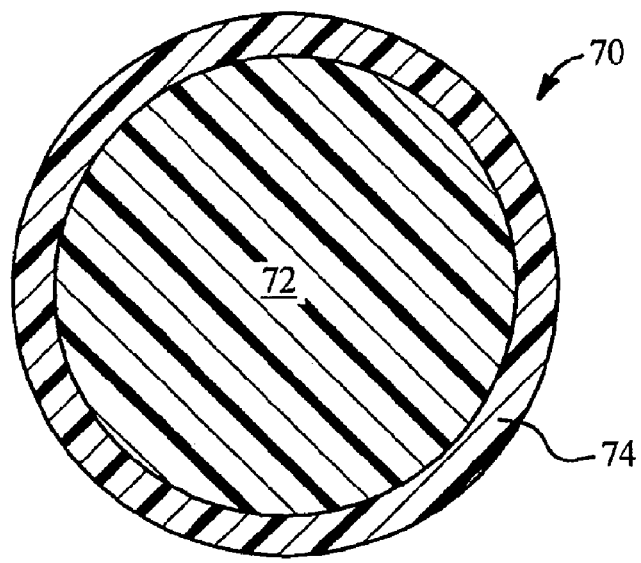
FIG. 3D is a sectional schematic illustration of a core and shell semiconductive particle of the VVM of the present invention.

The semiconductive particles 70 can be any such particles listed above in connection with FIG. 2. As seen in FIG. 3D, in one preferred embodiment, the semiconductive particles 70 have a semiconductive core 72 and an insulative shell 74, which can include silicon dioxide, epitaxial silicon, glass and any combination thereof. In one implementation, the semiconductive core 72 is made of arsenic doped N-type silicon having an average size of about two to about 30 microns, while the insulative shell 74 is silicon dioxide having an average thickness of on the order of nanometers.

In still a further alternative embodiment, the doped semiconductive core-shell or non-shell doped semiconductive particles 80 described above are used instead of or in addition to semiconductive particles 70. Insulating particles 60 can also be used.

In one implementation, the core-shell particles 90 of the third preferred embodiment of VVM 100 include an aluminum core 92 and an aluminum oxide shell 94 (the same as the second preferred embodiment). Alternatively, any of the core-shell particles 90 having a core 92 and a shell 94 can be used. The aluminum core 92 in one embodiment has an average size in the range of 10 to 30 microns. The aluminum oxide shell 94 in one embodiment has an average thickness on the order of nanometers.

The non-oxidized or non-coated conductive particles 90 of the third preferred embodiment of VVM 100 can be any of the particles described above in connection with the second preferred embodiment. In one implementation the non-oxidized or non-coated conductive particles 90 are tungsten particles of about 1 to about 10 microns in average size. The tungsten particles can be round, elongated, elliptical or ovular, agglomerated or not agglomerated as described above.

The resulting third preferred embodiment of VVM 100 has a resistivity of about 1400 ohm-cm to about 14×106 ohm-cm in one implementation, although different resistivities could be achieved based at least on particle loading, particle concentration and particle sizing. In one embodiment, the conductive particles 90 (core-shell) are provided in a concentration of about 15 to 45% by volume. The conductive particles 90 (non-oxidized core) are provided in a concentration of about 1 to 20% by volume and in one implementation about 10% by volume. The semiconductive (core-shell or non-shell) particles 70 or doped semiconductive core-shell or non-shell particles 80 are provided in a concentration of about 15 to 45% by volume and in one implementation about 30% by volume. Insulative binder 50 consumes the remainder of the volume, which can be any of the embodiments described above.

Yet Another Preferred VVM

In a fourth preferred embodiment, VVM 100 includes only the core-shell conductive particles shown in FIG. 3B. The insulative binder 50 is in one preferred implementation a polymer that is dissolved via carbitol acetate to have the direct application properties described herein.

In one implementation, the core-shell particles 90 of the fourth preferred embodiment of VVM 100 include an aluminum nitride core 92 and a silica shell 94. Alternatively, any of the core-shell particles 90 having a core 92 and a shell 94 can be used. For example, an aluminum or copper core 92 can be used (i) instead of or (ii) in addition to the conductive particles 90 having an aluminum nitride core 92 and a silica or oxide shell 94. In another example, an oxide shell 94 can be used (i) instead of or (ii) in addition to the conductive particles 90 having an aluminum or aluminum nitride core 92 and a silica shell 94.

The aluminum or aluminum nitride core 92 in one embodiment has an average size in the range of 10 to 30 microns. The aluminum oxide shell 94 in one embodiment has an average thickness on the order of nanometers. Conductive particles 90 have a bulk conductivity greater than 10 (ohm-cm)-1 in one embodiment.

The resulting fourth preferred embodiment of VVM 100 has a resistivity of about 1400 ohm-cm to about 14×106 ohm-cm in one implementation, although different resistivities could be achieved based at least on particle loading, particle concentration and particle sizing. In one embodiment, the core-shell conductive particles 90 are provided in a concentration of about 35 to about 75% by volume. Insulative binder 50 consumes the remainder of the volume and can be any of the embodiments described above. The resulting VVM has relatively low clamping voltage of about 65 volts to about 120 volts.

The fourth VVM 100 can alternatively or additionally include non-oxidized or non-coated conductive particles 90, which can be any of such particles described above. In one implementation the non-oxidized or non-coated conductive particles 90 are tungsten and/or nickel particles. The tungsten particles can be round, elongated, elliptical or ovular, agglomerated or not agglomerated as described above. The non-oxidized or non-coated conductive particles are provided in a concentration of about 2% to about 30% by volume.

Direct Application of VVM

Figure 4:
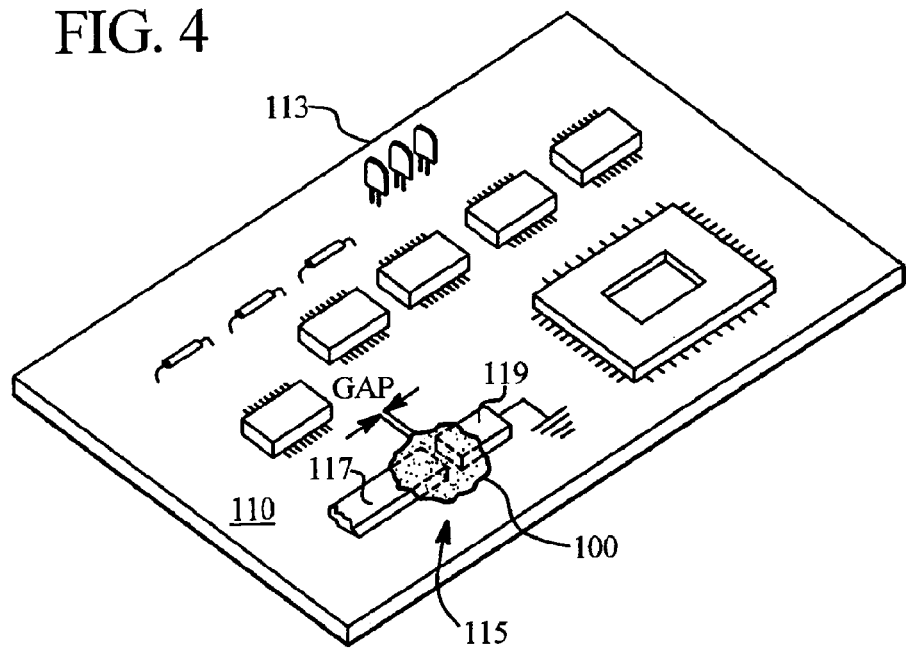
FIG. 4 is a perspective view of a rigid printed circuit board ("PCB") substrate that illustrates one circuit arrangement for the intrinsically adhesive VVM of the present invention.

Referring now to FIG. 4, one possible arrangement 115 for any of the embodiments of the intrinsically adhesive VVM 100 is illustrated. The arrangement 115 appears in this example on substrate 110, which is a rigid PCB. A number of other electrical devices 113 are illustrated, which shows that the VVM 100 is open and exposed when the PCB substrate 110 is in a finished form. The electrical devices 113 include any type of electrical device commonly connected to a PCB including both through-hole and surface-mounted devices. The electrical devices 113 include any electrical components, such as a resistor or capacitor. The electrical devices 113 also include any type of integrated circuit, connector, filter, etc.

The arrangement 115 resides next to the other electrical components 113 on the PCB substrate 110. The arrangement 115 is illustrated having two electrodes 117 and 119 that are each secured to the PCB substrate 110 via any method known to those of skill in the art. Although two electrodes 117 and 119 are illustrated, the arrangement 115 can have any number of electrodes. In the arrangement 115, the quantity of VVM 100 intrinsically adheres to the electrodes 117 and 119 and to the substrate 110. A gap exists between the electrodes 117 and 119, which is shown in phantom in this perspective view because it is covered by the quantity of VVM 100. The gap width in an embodiment is around 2 mils, however, larger or narrower gap widths may be used. The electrodes 117 and 119 normally do not electrically communicate with one another. Upon an EOS transient event, the VVM 100 switches from a high impedance state to a low impedance state, wherein a transient spike shunts, here, from the electrode 117 through the VVM 100 to the electrode 119, which is connected to a shield ground or earth ground as illustrated.

For convenience, the electrode 117 as illustrated terminating with a fragmented end. It should be appreciated that the electrode 117 can lead to any type of electrical device. In an embodiment, electrode 117 is a trace on the PCB that carries a signal, e.g., from a telecommunications transmission. In this case, the electrode 117 may lead to a connector that receives a telecom input line or to some type of transceiver.

Figure 5A:
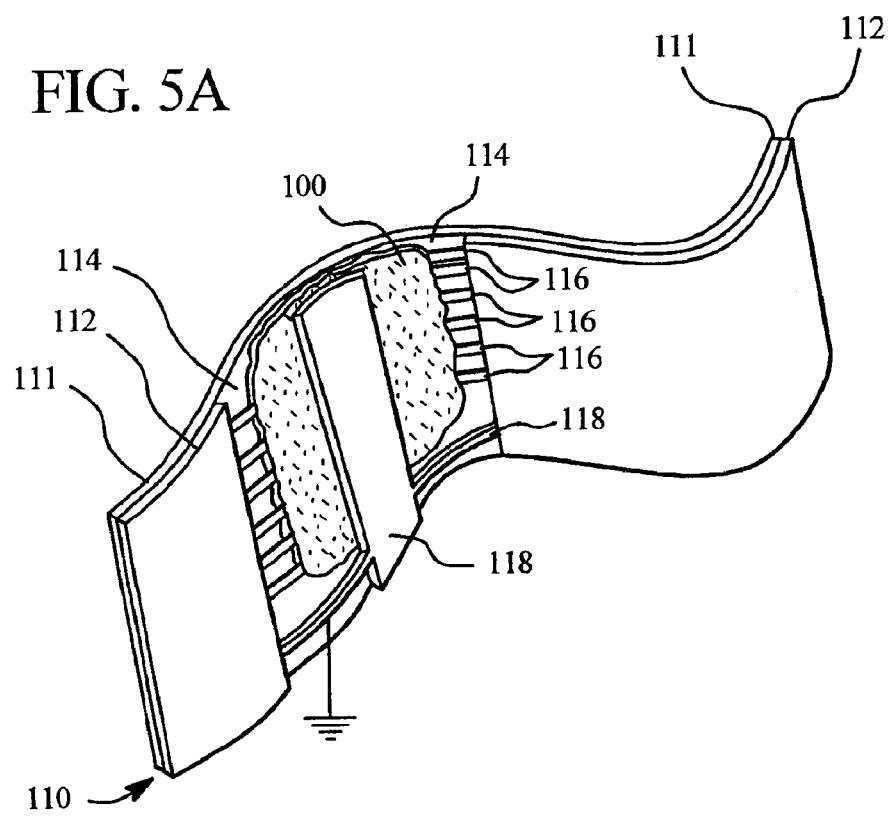
FIG. 5A is a perspective view of a flexible substrate having the intrinsically adhesive VVM of the present invention.

Referring now to FIG. 5A, a "Z" direction arrangement is illustrated on a substrate 110, which in an embodiment is a multilayered flexible ribbon or circuit. The flexible substrate 110 includes a plurality of flexible layers 111 and 112. As described above, the flexible substrate 110 may include layers 111 and 112 that are made of a polyimide. For example, the layers 111 and 112 may be Kapton®. In another embodiment, one or both of the layers 111 and 112 are mylar layers. A section of the layer 112 of the substrate 110 is cut away so as to illustrate a number of signal conductors 116 as well as a ground conductor 118. With the conductors 116 and the ground conductor 118 exposed, the self-adhesive VVM 100 having the self-curable binder 50 can be applied across each of the conductors 116.

As illustrated, each of the conductors 116 and the ground conductor 118 is separated by a gap, so that the conductors do not normally electrically communicate with one another. In an embodiment, the ground conductor (only a portion shown for convenience) 118 lays on top of the VVM 100. The gap is therefore said to be in the "Z" direction, wherein the gaps between the conductors 116 reside in an X-Y plane. The thickness of the VVM layer is less than the spacing between signal conductors 116. An EOS transient will therefore jump from one of the conductors 116 to ground 118 instead of to another conductor 116. In another embodiment, a separate ground trace 118 can be placed next to each signal trace, so that the transient will jump from a signal trace 116 to a ground trace 118. Either way, the layer of VVM 100 enables any of the signal conductors 116 that experiences an overvoltage to shunt same to a ground conductor 118.

As in the rigid PCB application of FIG. 4, the conductors or electrodes 116 (and 118) secure to a surface of a substrate. Here, conductors 116 secure to an inner surface 114 of the flexible layer 111 via any method known to those of skill in the art. In the "Z" direction embodiment, the ground conductor sticks to the top of the layer of VVM 100. The conductors 116 and ground conductor 118 are also compressed and held in place by the multiple layers 111 and 112. However, it is possible that the VVM 100 is exposed on the outside of one of the flexible layers 111 and 112. The quantity of VVM 100 covers each of the conductors 116 as illustrated and also intrinsically adheres to the inner surface 114 of the layer 111. The layer of VVM 100 self-cures to the plurality of conductors 116 and the inner surface 114 of the layer 111 without the need for an additional curing or heating step. In an alternative embodiment, however, the layer of VVM 100 may be more quickly cured by heating the flexible circuit for a predetermined amount of time.

The binder 50 as described above cures in such a manner that the quantity of VVM 100 does not crack or split even when the flexible substrate 110 is bent or moved. Even so, the exposed area of inner surface 114 and the ground plane 118 in a preferred embodiment are covered for purposes of electrical insulation. In an embodiment, the VVM 100 and the conductors 116 and ground conductor 118 are covered by a silver ink coating. The VVM in an embodiment can cover an entire surface of the traces 116 and ground trace 118 to enhance the dissipation ability of the VVM 100. In a further alternative embodiment, an intermediate insulative coating, such as a dry film photo-imagable cover lay, a spray liquid photo-imagable cover lay or a "glob-top" coating, can be disposed between the signal traces 116 and the inner surface 114 of outer insulating (e.g., plastic) layer 111.

Referring now to FIG. 5B, VVM 100 of the present invention is used in connection with a high-definition multimedia interface ("HDMI") circuit 30. VVM 100 is compatible with various types of high speed interfaces, such as Universal Serial Bus ("USB") Rev. 2.0, FireWire and HDMI. For ease of illustration, the following description is shown in connection with an HDMI circuit. It should be appreciated however that the teachings with respect to the HDMI circuit also extend to other types of high speed interfaces, such as those mentioned previously.

HDMI circuits or connectors are used in advanced audio/video interfacing. Circuit 30 can interface between any HDMI-enabled audio/video source, such as a digital video disk player, and an audio/video receiver or an audio and/or video monitor. HDMI circuits or cables are becoming more popular due to their ability to support standard, enhanced or high-definition video and audio on a single line or cable. HDMI circuit 30 in one embodiment is an all-digital audio/video interface. HDMI circuit 30 has a very large bandwidth, i.e., 5 Gbps, which supports current demands. For example, high definition television uses less than one-half of the available HDMI bandwidth, leaving bandwidth room to incorporate new technological advances.

In the embodiment illustrated in FIG. 5B, HDMI circuit 30 includes a cable 32 that embeds a plurality of signal line pairs 34, 36, 38 and 40. Signal line pair 34 includes positive line C1+, negative line C1− and a shield line located between lines C1+ and C1−. Signal line pair 36 includes positive line D0+, negative line D0−, separated by a shield line. Signal line pairs 38 and 40 follow the same format. It should be appreciated that HDMI circuit 30 can include fewer or more than four signal line pairs.

The insulation or dielectric of cable 32 that covers signal line pairs 34, 36, 38 and 40 is removed or stripped in certain places to enable a VVM-containing device 25 to be connected electrically to the signal and shield lines of pairs 34, 36, 38 and 40. Alternatively, cable 32 is fabricated to include electrodes or terminals that mate with the electrodes or terminals of device 25.

In an alternative embodiment, device 25 is located at an end of cable 32 and cooperates with an HDMI connector. In cooperating with such connector (e.g., one housing including both the connector apparatus and circuit protection apparatus), the device 25 contacts the signal and shield lines that extend from the protective covering of cable 32 and into the end terminations of the connector. Further alternatively, VVM 100 is applied directly beneath the protective covering of cable 32 in a manner similar to the embodiment shown in connection with FIG. 5A. That alternative embodiment employs a Z-direction application. Conversely, device 25 shown in FIG. 5B employs an X-Y or planer application.

In FIG. 5B, the top of housing 22 of device 25 has been cut away to illustrate the VVM 100, a plurality of signal conductors 24 and a plurality of shield conductors 26. Shield conductors 26 each lead to a common line that couples each of the signal conductors 26 electrically. Shield conductors 26 communicate individually with each of the shield lines of the signal pairs 34, 36, 38 and 40 and connect those shield lines to the common shield line.

The signal conductors 24 each extend from one of the positive and negative signal lines of the signal line pairs 34, 36, 38 and 40 to a point near the common shield line 26 to create a gap having a distance X. The signal conductors 24 are also spaced apart from one another at least a distance Y. The distance X is less than the distance Y. Accordingly, an EOS transient event occurring along any of the signal lines C1+, C1−, D0+, D0−, D1+, D1−, D2+ and D2− is shunted through VVM 100 to one of the shield lines 26 rather than to another signal conductor 24. VVM 100 in FIG. 5B can be any of the embodiments or formulations for the VVM discussed herein.

Figure 5C:
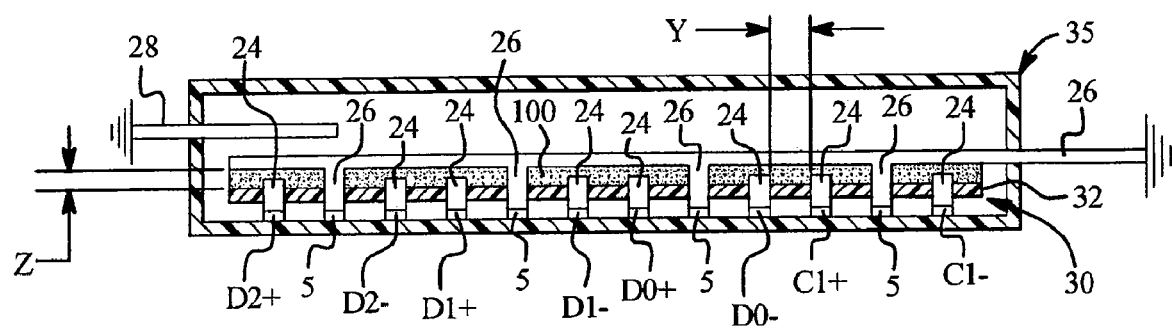
FIG. 5C is a sectioned elevation view of another embodiment for a high-definition multimedia interface ("HDMI") circuit protected with the VVM of the present invention.

FIG. 5C illustrates an end view of an alternative HDMI arrangement illustrated by a device 35. The view is taken along a plane defined by dashed line VC-VC shown in FIG. 5B. Device 35 also operates as an end connector for HDMI circuit 30. That is, device 35 can be of a male type that receives or mates with a mating female connector via any known connector mating method. Alternatively, device 35 is a female connector that receives or mates with a mating male connector via any known connector mating method.

Device 35 illustrates a Z-direction VVM application for protecting an HDMI circuit 30 as opposed to the X-Y or planer application of FIG. 5B. The cable or insulation 32 of HDMI interface 30 terminates inside device 35. As before, each of the signal lines C1+, C1−, D0+, D0−, D1+, D1−, D2+ and D2− communicates electrically with a signal conductor 24. Each of the shield lines (identified by letter S) of the HDMI circuit 30 communicates electrically with a shield conductor 26.

For purposes of illustration, a frame ground conductor 28 is also illustrated to show that in one embodiment, a transient spike is shunted to a signal shield line rather than to frame ground 28. Signal conductors 24 and shield conductors 26 each contact an area of VVM 100. As illustrated, the distance Z from each of the signal conductors 24 to the shield conductor 26 is less than the shortest distance Y between any two signal conductors 24. Accordingly, a transient spike will be shunted from one of the conductors 24 to the shield conductor 26 before shunting to another signal conductor 24.

Figure 6:
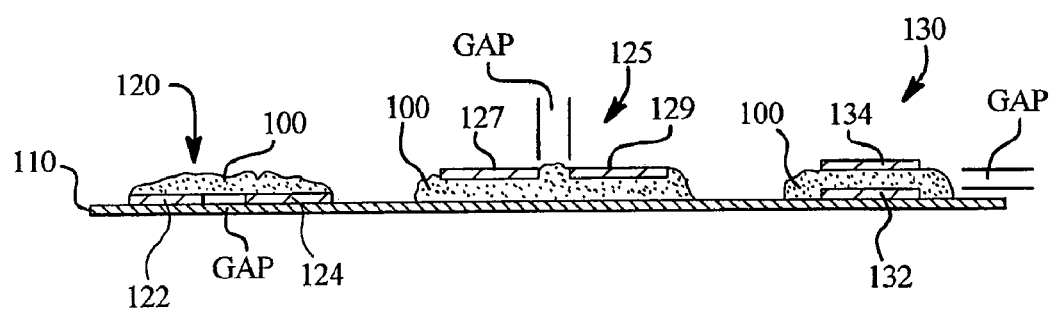
FIG. 6 is a sectioned elevation view illustrating three additional circuit arrangements for the intrinsically adhesive VVM of the present invention.

Referring now to FIG. 6, three alternative applications 120, 125 and 130 for the VVM 100 are illustrated. Each of the applications 120, 125 and 130 is illustrated in a simplified form having only two conductors. It should be appreciated however, that any of the applications disclosed herein can electrically connect and protect a multitude of conductors, such as in FIGS. 5A to 5C. It should also be assumed, although not illustrated, that one of the conductors is a ground or shield conductor, or another type of conductor with a low impedance path to ground, while at least one other conductor is a signal or line conductor, wherein the VVM 100 shunts and overvoltage transient from the line or signal conductor to the ground or shield conductor. Further, applications 120, 125 and 130 are illustrated in a finished form, wherein VVM 100 is open and exposed to the environment.

The arrangement 120 illustrates a circuit having conductors 122 and 124 that are spaced apart by a gap. Each of the conductors 122 and 124 is secured to the substrate 110 via any method known to those of skill in the art. The substrate 110 can be any of the substrates described above such as a rigid PCB substrate or a flexible circuit type of substrate. The application or circuit 120 differs from the circuit 115 in that the VVM 100 does not adhere to the substrate 110. To form such a circuit, it may be necessary to support the VVM 100 above the gap until the VVM 100 cures and dries in place. In another embodiment, a top layer or coating may also adhere to the VVM 100 wherein the coating enables the VVM 100 in a semi-cured state to be placed on the conductors 122 and 124. Importantly, the VVM 100 does not need to adhere to the substrate 110 in the gap area in order for the VVM 100 to function properly. The circuit 120 functions exactly the same way as the circuit 115 illustrated in FIG. 4, with regard to the shunting capabilities of the VVM 100.

The circuit or arrangement 125 illustrates that the VVM 100 can intrinsically secure to the substrate 110 and thereby form a buffer or bed onto which conductors 127 and 129 are placed. The electrodes 127 and 129 are separated by a gap. The electrodes may sink slightly into the VVM 100 as illustrated or the electrodes 127 and 129 may be placed onto the VVM 100 when the VVM has cured to the point that it does not deform due to the weight of the conductors or due to the application process. The circuit or arrangement 125 operates the same as the circuits 115 and 120.

The circuit or arrangement 130 illustrates an embodiment where one of the conductors, namely, the conductor 132 secures to the substrate 110, while a second conductor 134 is suspended on top of the layer of VVM 100, similar to the electrodes 127 and 129 of the arrangement 125. The gap in the circuit 130 is a vertically disposed gap. The gaps in the arrangements 115, 120 and 125 are horizontally disposed. It should be appreciated that the VVM 100 operates equally as well whether the gap is an "XY" direction type of gap, such as with the arrangements 115, 120 and 125, or whether the gap is a "Z" direction type of gap as illustrated in the arrangement 130.

Each of the arrangements of FIG. 6 may be desirable in certain electrical configurations and with certain electrical components. The VVM 100 having the insulative binder 50 of the present invention provides the flexibility to arrange electrodes in different ways with respect to the substrate 110, wherein the VVM 100 does not require an extra apparatus or housing to mechanically hold the VVM or to electrically connect it to the conductors. For example, many VVM devices require a housing or shell that holds the VVM in place. Many VVM's also include a pair of terminals disposed on the housing or shell that must be soldered to a pair of pads formed on the surface of the substrate. From the pads, additional traces or bond wires are required to extend to connecting signal lines or ground line.

Figure 7:
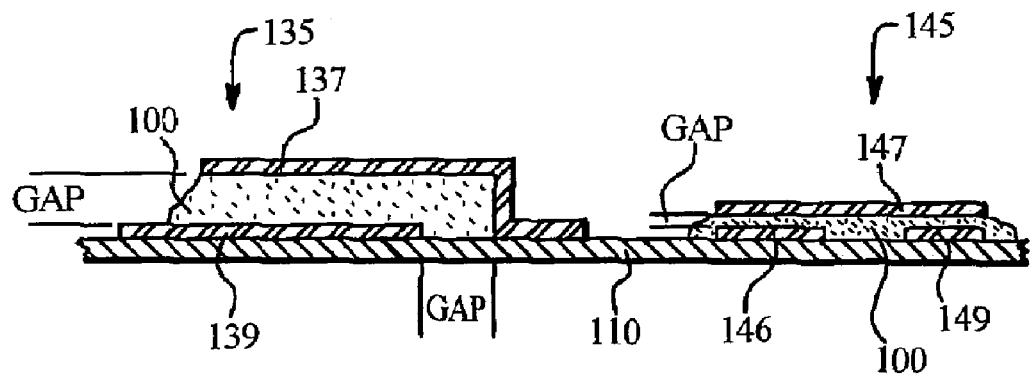
FIG. 7 is a sectioned elevation view illustrating two "Z" direction type circuit arrangements for the intrinsically adhesive VVM of the present invention.

Referring now to FIG. 7, an additional circuits or arrangements 135 and 145 are illustrated. The arrangement 135 is similar to the arrangement 130 in that there is a "Z" direction gap between an upper electrode 137 and a lower electrode 139, wherein the lower electrode 139 is secured to the substrate 110. In the arrangement 135, however, the upper electrode 137 extends laterally or horizontally away from the lower electrode 139 and turns downwardly to attach to the substrate 110. The horizontal offset creates a second gap. When an overvoltage occurs, the transient spike may conduct through VVM 100 either in the "Z" direction or in an "XY" direction, depending on which path has the lower impedance. The arrangement 135 otherwise operates the same as the other arrangements.

The arrangement 145 is similar to the flex circuit embodiment of FIG. 5A, except the conductors 146 and 149 are disposed on rigid substrate 110. In one embodiment, the floating conductor 147 is the ground conductor, making the arrangement a purely "Z" direction application. In another embodiment, either of the conductors 146 and 149 is the ground conductor making the application a "Z" direction and an "XY" direction application, wherein the voltage can discharge from one of the conductors 146 or 149, to the floating conductor 147, and down to the other conductor, which is the ground conductor.

Figure 8:
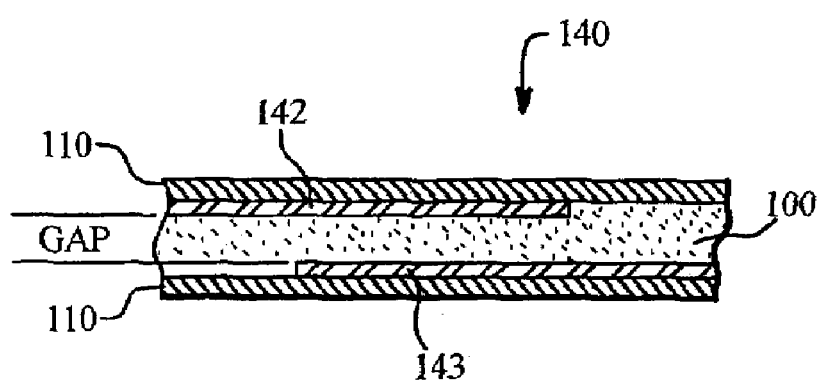
FIG. 8 is a sectioned elevation view illustrating still a further circuit arrangement for the intrinsically adhesive VVM of the present invention.

Referring now to FIG. 8, a further alternative arrangement or circuit 140 is illustrated. The circuit 140 includes two substrates 110, which may be a rigid substrates such as FR-4 boards, or a flexible substrates, such as a polyimide or Kapton®. A first electrode 142 is secured to the upper substrate 110, while a second electrode 143 secures to the lower substrate 110. The electrodes 142 and 143 are spaced apart in the "Z" direction by a quantity of VVM 100. The arrangement 140 is useful, for example, in a flexible circuit, wherein the substrates 110 are outer layers of Kapton® or mylar, and wherein the upper conductor 142, for example, is a signal conductor and the lower conductor 143 is a ground conductor. Here, a multitude of signal conductors can be applied to either the upper or lower substrates 110, wherein a transient spike travels vertically or horizontally depending upon where the signal trace having the transient spike is located with respect to a ground conductor.

Figure 9A:
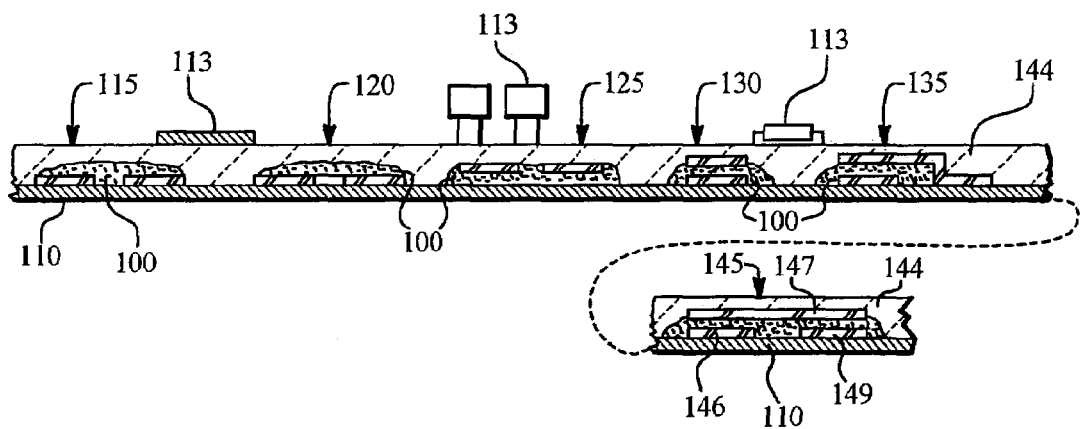
FIG. 9A is a sectioned elevation view illustrating the circuit arrangements of FIGS. 4, 6 and 7 laminated in a multilayer PCB.

Referring now to FIG. 9A, the previous arrangements or circuits 115, 120, 125, 130, 135 and 145 are illustrated as being imbedded inside a multilayer PCB. That is, the substrate 110 constitutes one layer of a PCB. A second substrate 144 (not to scale) constitutes another layer of the multilayer PCB. The layer 144 is formed around the various circuits so as to produce a smooth outer surface that is suitable for mounting electrical components 113 and circuit board traces. The configuration of FIG. 9A is particularly useful in that the outer surfaces of the substrates 110 and 144 are not inhibited whatsoever by the circuit protection. The embodiment illustrated in FIG. 9A can include more than two layers, and thus the embodiment can include a multitude of different substrates having one or more of the arrangements 115, 120, 125, 130, 135 and 145.

Figure 9B:
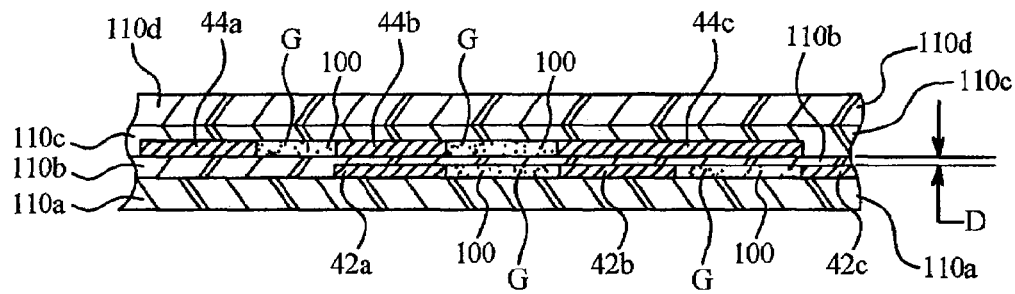
FIG. 9B is a sectioned elevation view illustrating another embodiment for providing the VVM of the present invention in a multilayer PCB.

Referring now to FIG. 9B, an alternative embedded multilayer PCB application for VVM 100 is illustrated. The PCB can be small enough to fit inside of a device that itself is surface mounted to a larger PCB. The PCB is alternatively a larger PCB that holds potentially large components, such as integrated circuits, capacitors, connectors and the like. The PCB is alternatively a flexible circuit or cable as described herein.

The application includes multiple insulating layers 110a, 110b, 110c and 110d. A plurality of electrodes 42a, 42b and 42c are applied to insulating layer or substrate 110a. The electrodes 42a, 42b and 42c define two gaps G between the electrodes. VVM 100 is placed in gaps G so that when the multilayer PCB is completed, VVM 100 contacts the sides of electrodes 42a, 42b and 42c but does not contact or substantially contact the top of electrodes 42a through 42c. In that manner, the VVM 100 is substantially flush with the tops of electrodes 42a to 42c and enables a smooth upper insulating layer 110b to be applied to (i) lower insulating layer 110a, (ii) electrodes 42a through 42c and (iii) VVM areas 100. In alternative embodiments, shown for example in FIG. 9A, the VVM is not applied as judiciously and extends above the electrodes and/or contacts a greater portion of the tops of the electrodes.

Smooth insulating layer 110b is capable of receiving a next layer of electrodes 44a, 44b and 44c that define gaps G. Any of the gaps G of FIG. 9B can be sized to be about 0.005 inch (127 microns). The electrodes or traces 42a to 42c and 44a to 44c are nickel plated adjacent to the gap area in one embodiment.

The application process for VVM 100 is repeated to fill the gaps G between electrodes 44a to 44c with VVM 100 so that the VVM 100, when the multilayer board is completed, lies substantially flush with the tops of electrodes 44a to 44c. That even and flush application enables a smooth third insulating layer 110c to be applied to (i) electrodes 44a to 44c, (ii) insulating layer 110b and (iii) VVM areas 100. The smooth top surface of insulating layer 110c enables another flat or finishing insulating layer 110d to be applied thereon.

In an embodiment, outer insulating layers 110a and 110d are FR-4, ceramic or other type of insulating material such as epoxy resin, resin coated foil, teflon, polyimide and glass. Alternatively, more malleable or non-rigid insulators can be used for the outer coatings 110a and 110d. Inner insulating layers 110b and 110c are alternatively made of a non-rigid insulator, such as epoxy resin, a polymer insulator, a b-stage material (with or without copper) and the like. It should be appreciated that relatively rigid FR-4-type insulators can also be provided as internal insulating layers, however, woven glass FR-4 may damage VVM 100 causing resistance shifts after ESD pulsing. A non-glass insulator should therefore be used when contacting VVM 100. It should further be appreciated that third and fourth layers of electrodes and VVM areas 100 can be provided (or any suitable number of layers according to specification).

FIG. 9B illustrates that insulation layer 110b resides between VVM 100 and electrode or trace 44c. In such a case, insulation layer 110b has to provide a minimum separation distance D between VVM 100 and electrode 44c. Minimum separation distance D ensures that a transient spike will travel in the direction across gap G, from electrode 42b to 42c or vice versa instead of from electrode 42b or 42c in the Z direction to electrode 44c. The minimum separation distance D is dependent upon the dielectric strength of the insulation layer 110b, e.g., of cured epoxy resin, and upon the maximum ESD pulse magnitude requirement. The relationship can be expressed as follows:

Minimum Separation (D)=Maximum ESD Magnitude/Dielectric Strength

For example, if the embedded ESD device must withstand a maximum ESD pulse of 15 kV and the insulation layer 110b, e.g., cured epoxy resin, has a dielectric strength of 150 kV/mm, the minimum separation is:

15 kV/150(kV/mm)=0.1 mm or 4 mils

The minimum separation distance D is required whether VVM 100 is made to be substantially flush with electrodes 42a to 42c and 44a to 44c as seen in FIG. 9B or whether the VVM extends above the electrodes and perhaps contacts at least a portion of the top of the electrodes as seen in FIG. 9A for example. For example, if VVM 100 is applied so that it resides on average one mil higher than the thickness of the electrodes and the minimum separation distance D is four mils as shown above by example, the upper Z direction electrode should reside at least five mils above the lower electrode, at least at the point where VVM 100 is applied.

The multilayer PCB of FIG. 9B enables circuits eventually applied to the PCB to be protected beneath the surface of the board, i.e., without utilizing board (including flexible cabling) surface space. Certain multilayer PCBs include circuitry and components located on the inner layers. The embodiment of FIG. 9B illustrates one effective way for providing circuit protection for such inner circuits and components.

Figure 10:
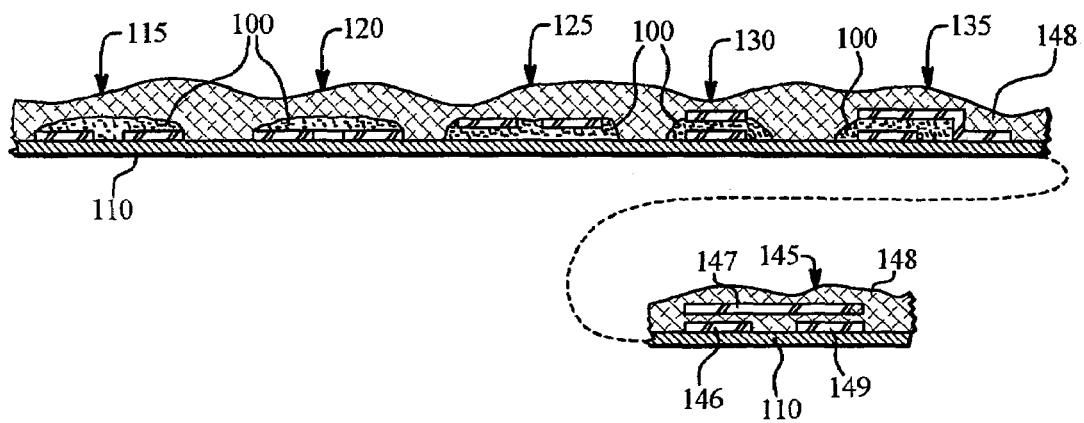
FIG. 10 is a sectioned elevation view illustrating the circuit arrangements of FIGS. 4, 6 and 7 covered with a protective coating.

Referring now to FIG. 10, a similar arrangement is illustrated having the circuits 115, 120, 125, 130, 135, and 145, wherein instead of the arrangements being part of a multilayer PCB, the arrangements are covered by a protective coating 148. Even though the VVM 100 self-secures to various electrodes and to the substrate 110 in certain places, it may also be desirable for a number of reasons to apply a protective coating 148. For example, as with the flexible circuit illustrated in FIG. 5A, the conductors may be exposed at certain points and require electrical insulation. The protective coating 148 can be any type of coating known to those of skill in the art. In an embodiment, the coating includes any of the coatings described above for the flexible circuit in FIG. 5A, such as a silver ink, a dry film photo-imageable cover lay, a spray liquid photo-imageable cover lay or a "glob-top" coating.

Methods of Application

Figure 18:
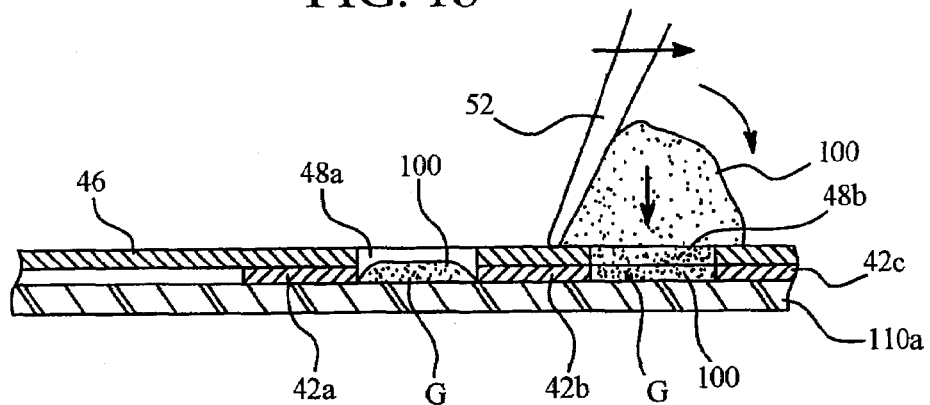
FIG. 18 is a side elevation view of a screen or stencil printing application of the VVM of the present invention into gaps between conductors on an insulating layer of a PCB.
Figure 19:
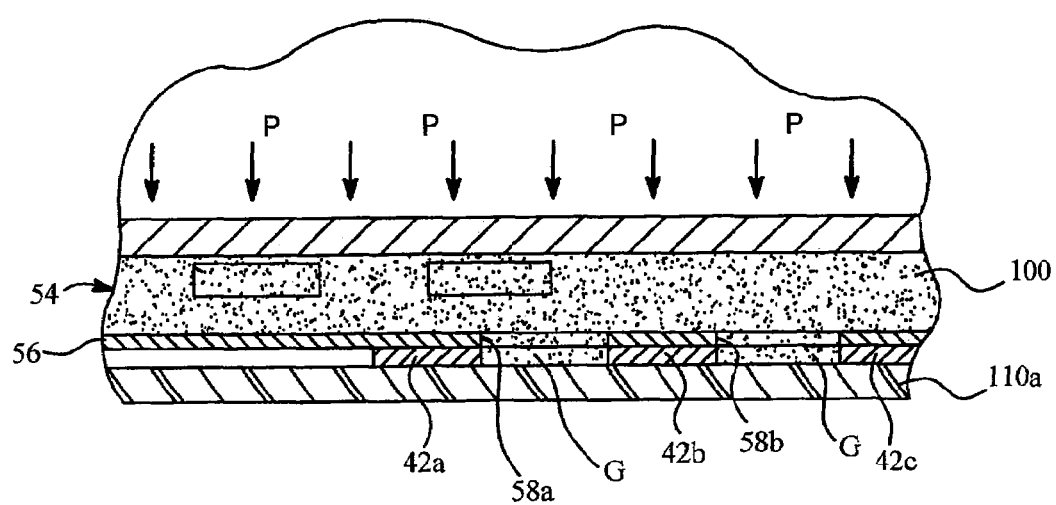
FIG. 19 is a side elevation view of one embodiment for directly depositing the VVM of the present invention into gaps between conductors on an insulating layer of a PCB.
Figure 20:
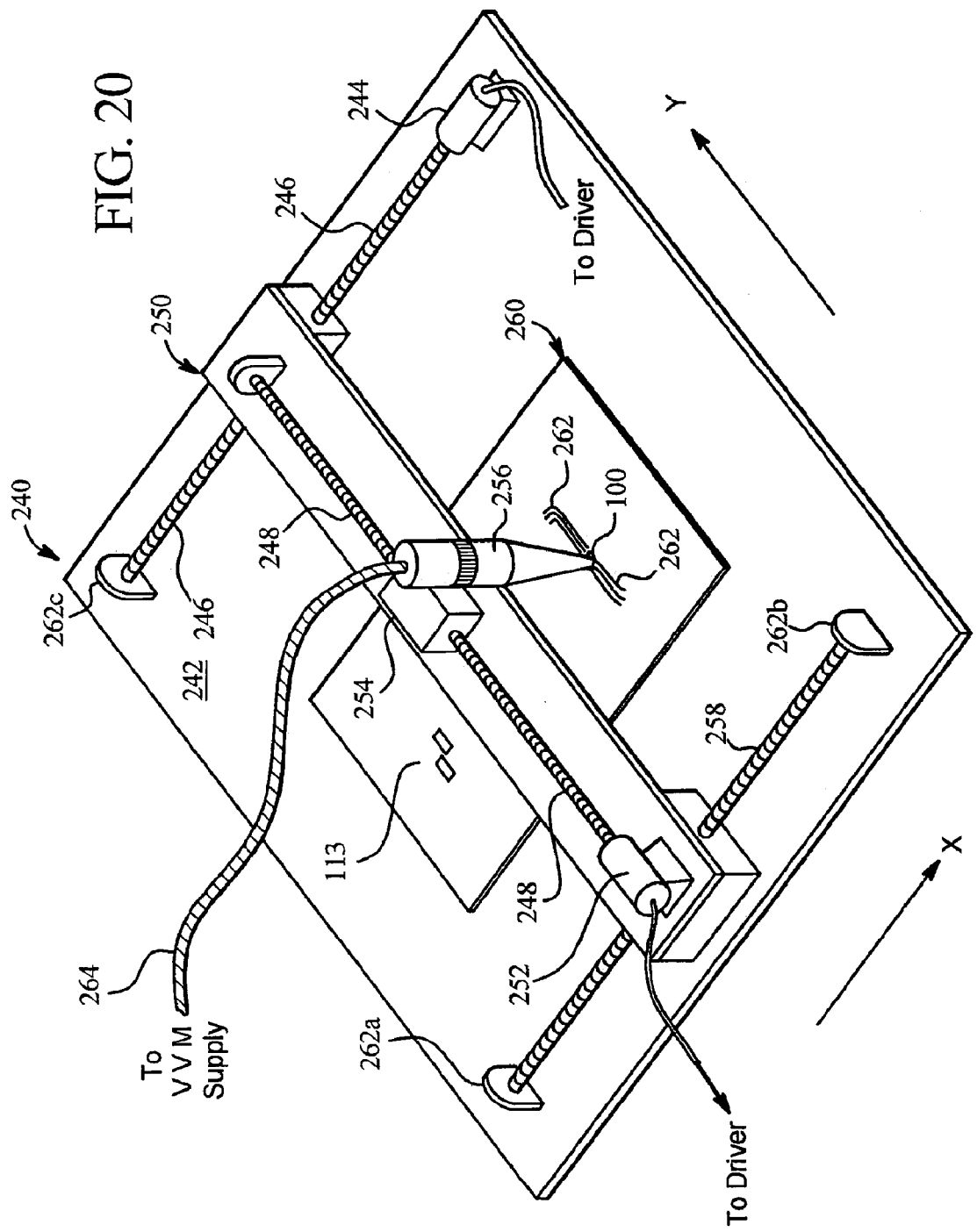
FIG. 20 is a schematic perspective view of another embodiment for directly depositing the VVM of the present invention into gaps between conductors on an insulating layer of a PCB, which uses a pick and place apparatus.

The present invention provides a multitude of ways for producing the VVM circuit board or substrate applications of FIGS. 4 through 10, and in particular the multilayer circuit board of FIG. 9B. Referring now to FIGS. 18 to 20, certain methods are illustrated. FIG. 18 illustrates the insulating layer 110a and electrodes 42a through 42c of FIG. 9B. A screen, fine mesh or stencil 46 is laid over electrodes 42a through 42c and gaps G between those electrodes. A squeegee 52, which can be made of a rubber rod, rubber plate, flat metal or other material and shape is applied to screen or stencil 46. The squeegee 52 includes a smooth and non-sticking surface and a sharp printing edge. The configuration and swiping application of squeegee 52 causes VVM 100 to roll and translate along the top of stencil 46, which helps prevent clogging of apertures 48a and 48b, defined by stencil or screen 46. As illustrated by the arrows in FIG. 18, the horizontal action of squeegee 52 rolls VVM 100 clockwise as shown in FIG. 18 and translates VVM 100 through apertures 48a and 48b of screen 46 into the gaps G between electrodes 42a, 42b and 42c. To ensure an accurate print of VVM 100 into gaps G, a vision system can be used to detect proper alignment between screen or stencil 46 and electrodes 42a and 42c.

As seen in FIG. 18, the newly applied VVM 100 can extend into apertures 48a and 48b of stencil or screen 46 above the level where VVM 100 would be flush with the tops of conductors 42a and 42b. Insulating layer 110b (FIG. 9B) and its application process compress VVM 100 flush to the tops of electrodes 42a and 42b and fill interstices left within gaps G. Alternatively, the thickness of stencil or screen 46 is so thin that the VVM as applied by squeegee 52 is already virtually flush with the tops of electrodes 42a to 42c prior to the application of the next insulating layer 110b. After insulating layer 110b and upper electrodes 44a to 44c (FIG. 9B) are applied, the screen or stencil-printing operation is performed again, and so on as many times as necessary to produce a multilayer board of a desired number of layers and thickness.

FIG. 19 illustrates an alternative embodiment for applying the VVM 100 into gaps G so that the VVM is flush or substantially flush with the tops of electrodes 42a to 42c. Here, a dispenser 54 is used to dispense VVM 100 directly into gaps G. Dispenser 54 includes a dispensing plate 56 defining apertures 58a and 58b. Apertures 58a and 58b are aligned with gaps G between electrodes 42a to 42c so that VVM 100 is placed in the desired locations. A plate is pressurized (illustrated by arrows marked P) to push VVM 100 through apertures 58a and 58b in plate 56 into gaps G.

Pressure P can be applied to dispenser 54 pneumatically or mechanically, e.g., via a screw conveyer. VVM 100 can alternatively or additionally be atomized or provided in the form of an ink. In such a case, plate 56 provides many small holes instead of larger apertures 58a and 58b to spray or dispense VVM 100 into gaps G.

The processes illustrated in connection with FIGS. 18 and 19 may or may not use an additional trimming step to trim excess VVM from electrodes 42a to 42c and/or other areas of the printed circuit board. In one embodiment, a laser is employed to trim the excess material from electrodes 42a to 42c, etc. It is also expressly contemplated to provide and dispense the VVM 100 in such an efficient manner that trimming is not necessary. The resulting application as shown above can provide VVM protection for a plurality of electrodes and in different areas on an insulating layer. Such protection can also occur on multiple inner layers of a multilayer PCB as well as on one or more outer layers of the PCB.

FIG. 20 illustrates an application of VVM 100 of the present invention using a pick and place or X-Y gantry system 240. System 240 includes a base 242 upon which an X-direction motor 244 is mounted. Motor 244 is coupled to a high precision lead screw 246. Lead screw 246 drives an X-direction gantry 250. X-direction gantry 250 in turn supports a Y-direction motor 252. Motor 252 is coupled to a second high precision lead screw 248. Lead screw 248 drives a Y-direction gantry 254. A VVM dispenser 256 is coupled to Y-direction gantry 254 and can be moved in both X and Y directions precisely to dispense VVM 100 selectively at desired locations on a printed circuit board 260. Printed circuit board 260 includes traces or electrodes 262 defining gaps (not illustrated) between which VVM 100 is applied as discussed above. Printed circuit board 260 also includes other electrical devices 113 as described above in connection with FIG. 4.

X-direction gantry 250 is balanced and supported by a shaft 258, which is coupled to base 242 via bearings and pillow blocks 262a and 262b. A third bearing 262c and pillow block is also provided to support one end of lead screw 246. Motors 244 and 252 are highly accurate motors that can control precisely the location of dispenser 256 relative to PCB 260. In one embodiment, motors 244 and 252 are stepper motors that receive motor currents from drivers that are controlled via a software program. Those components collectively control acceleration, velocity and distance traveled, thus setting the acceleration, velocity and X-Y location of gantries 250 and 254 as well as dispenser 256. The motors can also start, stop and change directions very quickly, increasing production speed. Lead screws 246 and 248 are sized so that dispenser 256 can reach any part of PCB 260. In an alternative embodiment, linear motors are used instead, replacing lead screws 246 and 248.

Pressurized VVM 100 is fed from a supply (not illustrated) through a supply line 264 to dispenser 256. Dispenser 256 is equipped with a valve (not illustrated) or other type of metering apparatus or dispenser that dispenses a desired quantity of VVM 100 at a desired time and location. Trimming with a razor blade or knife may be done to remove excess VVM. The valve or metering device may be left open in certain instances where a stream, strip, curved or oblong shaped deposit of VVM is to be formed. To that end, the pick and place or X-Y gantry system 240 enables VVM to be applied in one or more trace-like patterns, similar to the copper traces or electrodes. The pressurized feed of VVM through dispenser 256 enables VVM 100 to be fed continuously as the dispenser is moved in two dimensions about PCB 260. The dispenser can also be stopped at certain points to apply more VVM at a desired location.

Devices Employing Direct VVM

Figure 11:
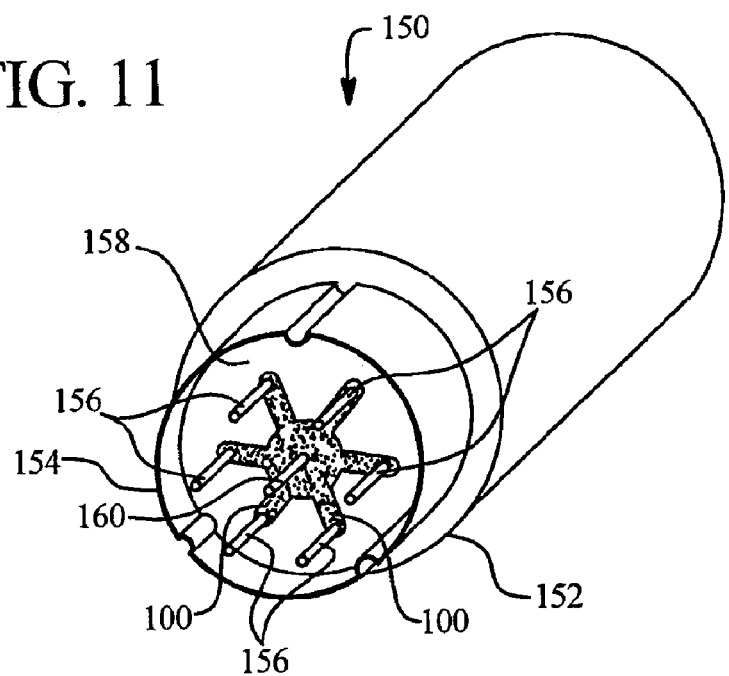
FIG. 11 is a perspective view of one embodiment of a DIN connector having the directly applied VVM of the present invention.

Referring now to FIG. 11, the VVM 100 of the present invention may be employed in a device. Two devices are illustrated above in connection with FIGS. 5B and 5C. Those devices interface with a plurality of substantially parallel signal and shield conductors of an HDMI type connector. Another type of device illustrated in FIG. 11 includes a variety of connectors that comply with the Deutsches Institut für Normung eV ("DIN") standards. A circular DIN connector 150 is illustrated. It should be appreciated that the present invention may be adapted for miniature DIN connectors, double row elongated DIN connectors, shielded DIN connectors, etc. The present invention may be implemented in a plug or receptacle. Vertical, horizontal and in-line connectors that attach to a cable may also be employed. Otherwise, the DIN connector may be panel mounted.

The connector 150 includes a body 152 that is constructed of any suitable material. The body, in both plug and receptacle implementations, secures a circular wall 154 or a plurality of straight walls (not illustrated) that at least partially encompass a plurality of signal conductors 156. The conductors 156 extend from a substrate 158 in a direction that is substantially parallel with the wall 154. The wall 154 and conductors 156 plug into a mating female DIN connector as is well known.

In the illustrated embodiment, the body 152 is a plug and the conductors 156 are pins. In an alternative embodiment (not illustrated), the body is a receptacle, and the signal conductors are sockets that receive pins from a mating connector. The connector 150 may be configured so that the body 152 secures any number of input/output conductors 156. One or more of the outer signal conductors 156 may be a ground conductor. Normally, however, a separate (here central) ground or shield ground conductor 160 is provided. In order for the illustrated embodiment to properly shunt a transient voltage spike to the ground conductor 160, the spacing between the input/output conductors 156 and the ground conductor 160 should be less than the spacing between the input/output conductors 156.

In one embodiment, the substrate 158 is a PCB, such as an FR-4 board. In another embodiment, the substrate 158 includes another type of insulative material, such as a polyimide or plastic. The substrate 158 fits inside the body 152 so that the connector 150 may be properly placed into a mating connector. In an embodiment, substrate 158 defines apertures that enable the conductors 156 to extend through from a back side of substrate 158 to the illustrated front side.

At least one quantity of VVM 100 is directly adhered or cured to the substrate 158. As illustrated, the VVM 100 of the present invention directly connects the signal conductors 156 to the ground conductor 160 without the need for traces or bond wires. In another embodiment, one or more conductors 156 or further alternatively the ground conductor 160 may contact an individual quantity of VVM 100, wherein one or more traces or bond wires individually secure the VVM 100 to another VVM quantity or to another conductor. The traces in an embodiment are copper that is etched onto the PCB substrate 158 as is well known. The signal traces can communicate with either or both the single signal conductors 156 and/or the ground conductor 160.

The ground conductor 160 may take several forms and is illustrated here as a centrally located pin 160. In each configuration, the adhesive binder 50 enables the VVM 100 to adhere directly to the metal conductors. The ground conductor 160 may act as either a circuit ground or a shield ground, as desired.

As illustrated, at least one quantity of VVM 100 protects one or more signal conductors 156 from a transient voltage spike. The protected connector 150 in turn can protect other electrical devices that are either electrically upstream or downstream from the connector 150.

Figure 12:
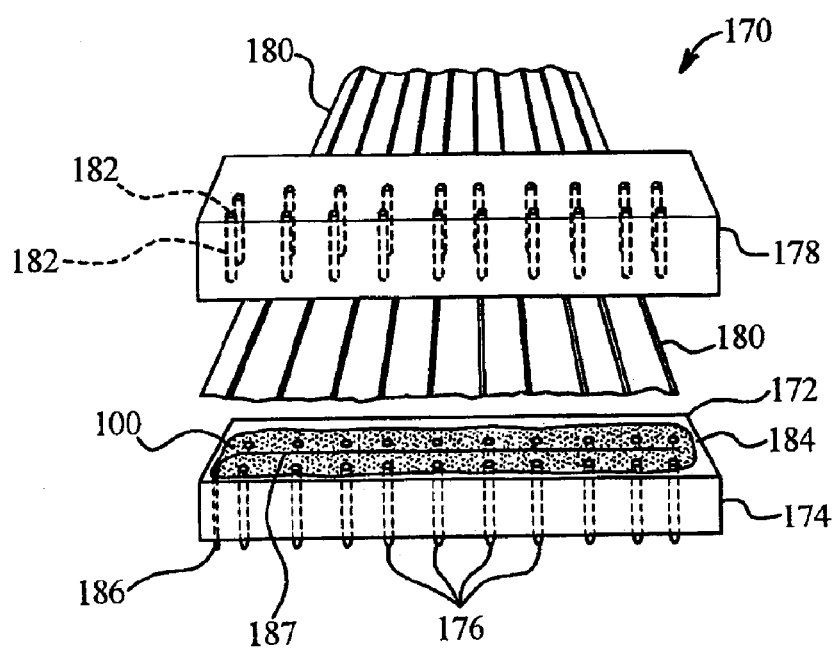
FIG. 12 is a perspective view of one embodiment of a ribbon cable connector having the directly applied VVM of the present invention.

Referring now to FIG. 12, the VVM 100 having the integrally adhesive binder 50 is used with a ribbon cable connector 170. The VVM 100 can be used with any type of ribbon cable connector, such as a male, female, straight lead, right angle, straight lead/wire wrap and right angle/wire wrap version of a socket connector, D-connector, PCB connector, card edge connector, dip connector, pin connector or termination jumper. The VVM 100 may be implemented in a plug or receptacle type of ribbon connector 170.

The ribbon connector 170 includes a body 172 that is constructed of any suitable material and in an embodiment is plastic. The body 172, in both plug and receptacle implementations, at least partially encompasses a plurality of conductors 176. The conductors 176 are substantially parallel with the walls of the body 172. If the body 172 is a plug, the conductors 176 are pins. If the body 172 is a receptacle, the conductors 176 are sockets that receive pins. The ribbon connector 170 may secure any number of input/output signal conductors 176. One or more of the conductors 176 may be a ground conductor. Normally, a separate circuit ground or shield ground 186 is provided. A ground strip 187 connects to the ground pin 186 and provides the proper spacing so that a voltage transient dissipates from one of the signal conductors 176 to the ground strip 187 rather than to another signal conductor 176.

Between the body 172 and a second mating body 178 lies a ribbon cable 180. Ribbon cable 180 may be any suitable cable including a gray flat cable, color coded flat cable, twisted pair flat cable and round jacketed/shielded flat cable. In the illustrated embodiment, the second body 178 is a plug that fits over the receptacle body 172. Pins 182 housed inside the plug body 178 pierce the insulation of the cable 180 and create electrical contact with conductors inside the cable.

In the illustrated embodiment, at least one and possibly a plurality of quantities of VVM 100 directly secure to the receptacle body 172 and the conductors 176 via the intrinsically adhesive property of the binder 50. The receptacle body 172 includes a substrate 184, which can be a polymer, a PCB material such as FR-4 or a polyimide. The VVM 100 can be applied to either the top or bottom surfaces of the substrate 184. In an alternative embodiment, traces are applied to the substrate 184 through any suitable method. The traces electrically connect the signal conductors 176 to the VVM 100, the VVM 100 to the ground conductor 186, or both.

As illustrated, at least one quantity of VVM 100 protects one or more signal conductors 176 of the ribbon cable connector 170 from a transient spike That is, the signal conductors 176 can shunt an overvoltage to the ground pin 186. The ribbon connector 170 can in turn protect electrical devices that are either electrically upstream or downstream from the connector 170.

Figure 13:
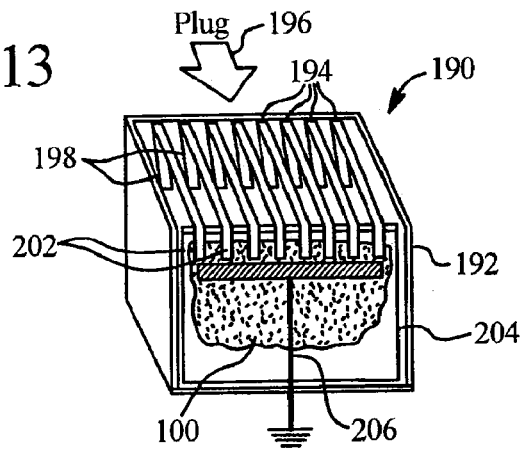
FIG. 13 is a cutaway perspective view of one embodiment of a data/telecommunications RJ type connector having the directly applied VVM of the present invention.

Referring now to FIG. 13, the VVM 100 having the integrally adhesive binder 50 is used with a data or telecommunications connector 190. The VVM 100 can be used with any type of data/telecom connector. In an embodiment, connector 190 is an eight conductor RJ-45 connector, commonly used in data networks, such as local area networks ("LAN's"), wide area networks ("WAN's") and the like. In another embodiment, connector 190 is six conductor RJ-11 connector, commonly used in residential and in certain commercial telephone systems.

The connector 190 includes a body 192, much of which has been cut away in FIG. 13 to show the circuit protection provided by the VVM 100. The body 192 is constructed of any suitable material and in an embodiment is plastic. The body secures a number of signal conductors 194. The signal conductors 194 are bent appropriately to engage mating signal conductors of a plug (not illustrated). The plug is inserted into the data/telecom body 192 in the direction of arrow 196. When the plug inserts into the body 192, spring portions 198 of the signal conductors 194 bend so that a spring force is applied to the electrical connection between mating conductors.

In the illustrated embodiment, opposing ends 202 of the conductors 194 electrically communicate directly with one or more quantities of VVM 100, which is directly applied to substrate 204 via the intrinsically adhesive binder 50. VVM 100 directly electrically couples the signal conductors 194 to a ground conductor 206. As above, the ground conductor 206 is properly positioned, spaced closer to each of the signal conductors 194 than the signal conductors 194 are to each other. In another embodiment, the ends 202 of the conductors 194 electrically connect with traces to which the VVM 100 adheres. In a further embodiment, the VVM 100 electrically connects to the ends 202 of the signal conductors 194 via wire bonds.

Similarly, the VVM 100 in an embodiment, directly adheres to the ground conductor 206. In another embodiment, the ground conductor 206 electrically communicates with the VVM 100 via one or more traces secured to the substrate 204. In a further embodiment, the VVM 100 electrically communicates with the ground conductor 206 via a bond wire.

In the above described manner, one or more or all of the signal conductors 194 may be protected from a transient voltage. Because LAN's or WAN's typically encompass large distances between grounding points, ESD and EOS transients between the grounding points are serious problems. Devices such as air conditioners, heaters, elevators, copiers and laser printers, etc., can cause high levels of spikes and transients in buildings having LAN's. The protected data/telecom connector 190 protects devices connected to a network through the connector 190 from transient voltages occurring over the data lines of the network. Likewise, the connector 190 protects the data lines from an overvoltage event emanating from a device connected to the network.

Figure 14:
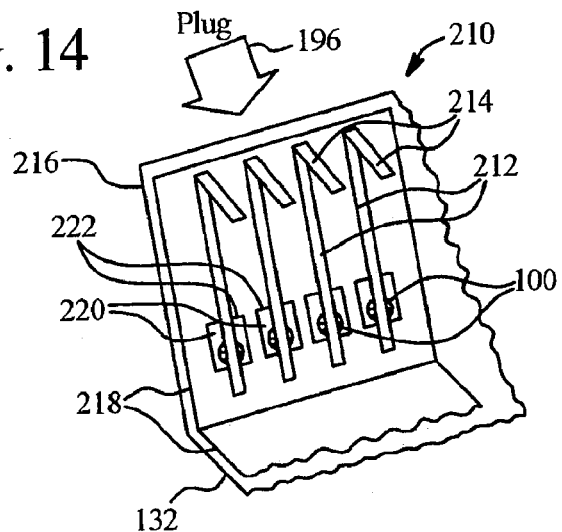
FIG. 14 is a cutaway perspective view of a number of signal conductors and a shield of one embodiment of a data/telecommunications RJ type connector having the directly applied VVM of the present invention.
Figure 15:
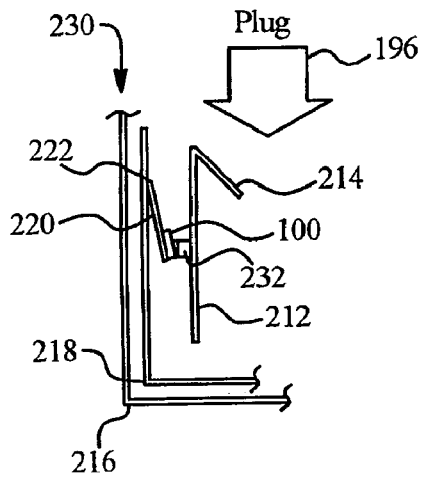
FIG. 15 is a side elevation view of a signal conductor, a shield and a capacitor of one embodiment of a data/telecommunications RJ type connector having the directly applied VVM of the present invention.

Referring now to FIGS. 14 and 15, other embodiments of the VVM 100 applied to telecommunications connectors are illustrated. The configurations illustrated in FIGS. 14 and 15 represent any type of data/telecom connector. In FIG. 14, only the relevant portion of the connector 210 is illustrated. The connector 210 includes a plurality of signal conductors 212 with the bent ends 214, wherein the bent ends 214 mate with conductors or a data/telecom plug (not illustrated) as described above. The plug travels in the direction of the arrow 196, which inserts into the connector 210.

A body 216, cutaway for purposes of illustration, houses a shield 218, which is constructed of any suitable conductive material. The view of FIG. 14 is generally from underneath the connector as it is illustrated in FIG. 13. The shield 218 therefore fits on top of and in back of the conductors 212.

The shield defines one or more cutout spring tabs 220. That is, the thin metal shield 218 is stamped or cut along three sides of each tab 220, wherein the tab 220 is bent inward along the edge 222. The tabs 220 may be bent inward to any desired angle less that 90°. When the shield 218 is placed over the conductors 212, the tabs 220 contact the conductors 212 and bend back towards 0°. The tabs 220 are therefore biased to maintain electrical contact with the conductors 212.

A quantity of VVM 100, having the self-curing intrinsically adhesive binder 50 is directly applied to the tabs 220, between the tabs 220 and the conductors 212. The VVM 100 acts as an open circuit in its high impedance state, so that little current normally flows from the conductors 212 to ground 218. When an ESD transient occurs, the VVM 100 switches to its low impedance state, so that the transient spike shunts to the shield ground 218.

In an embodiment, a stencil is used to apply a plurality of quantities of VVM 100 to a plurality of tabs 220. In another embodiment, a stencil is used to apply a plurality of quantities of VVM 100 to a single tab 220 that spring-loads and causes contact to occur with a plurality of conductors 212. In a further embodiment, a layer of the VVM 100 material is first self-adhered to a large area of the shield 218, wherein a plurality of tabs 220 are then stamped so that each has an individual quantity of VVM 100. In yet another embodiment, a layer of the VVM 100 is first self-adhered to a large area of the shield 218, wherein one or more tabs 220 that each contact a plurality of conductors 212 is stamped.

Referring to FIG. 15, which is a side view of FIG. 14, a variation of the connector 210 of FIG. 14 is illustrated as a new connector 230. As before, the body 216 is cutaway to reveal a portion of the shield 218. The shield 218 has been stamped so that the tab 220 bends inward along the edge 222 between the shield 218 and the conductor 212. The tab includes a quantity of VVM 100 having the self-adhesive binder 50 of the present invention.

The signal conductor 212 has the bent spring portion 214 that is adapted to mate with a conductor of a plug (not illustrated), wherein the plug inserts into the connector 230 in the direction indicated by the arrow 196. In one embodiment, a coupling capacitor 232 is disposed between the VVM 100 on the tab 220 and the signal conductor 212. Tab 220, VVM 100, capacitor 232 and signal conductor 212 are connected in series in one preferred embodiment. The capacitor 232 has a capacitance and voltage rating appropriate to handle a DC voltage of 2500 volts. That is, the coupling capacitor 232 is designed to block out high levels of DC voltage, such as those imposed during high potential [HI-POT] testing, to which LAN or Ethernet systems may become exposed.

The VVM 100 also adheres to and makes electrical contact with the capacitor 232. The capacitor 232 may also be soldered or otherwise electrically connected to the conductor 212. The spring loading of the tab 220 also holds the capacitor 232 in place. The order of the capacitor 232 and the VVM 100 may be reversed. It should also be appreciated that in FIGS.

14 and 15, the stamped tabs 200 may be used alternatively with a VVM device (not illustrated) that uses any VVM known to those of skill in the art.

FIGS. 11 through 15 illustrate that the VVM 100, through the binder 50, can be applied directly to a substrate, wherein the substrate is used in a piece of electrical equipment, such as a connector. Besides the various connectors illustrated, it should be appreciated that the substrate can be placed in other types of connectors, such as digital video interfacing ("DVI") connectors, analog to digital converter ("ADC") connectors, etc., as well as other types of equipment, such as audio headsets, camcorders, televisions, radios, personal email devices, computers, etc.

It should be understood that various changes and modifications to the presently preferred embodiments described herein will be apparent to those skilled in the art. Such changes and modifications may be made without departing from the spirit and scope of the present invention and without diminishing its attendant advantages.

The invention is claimed as follows:

1. A flexible circuit having overvoltage protection comprising:
    a first flexible layer;
    a plurality of signal conductors applied to the first flexible layer;
    at least one ground conductor positioned adjacent to at least one of the signal conductors;
    a layer of voltage variable material ("VVM") applied to the plurality of signal conductors and the at least one ground conductor such that a first path through the VVM from any of the signal conductors to the at least one ground conductor is smaller than a second path through the VVM from any of the signal conductors to a closest adjacent signal conductor; and
    a second flexible layer covering the signal conductors, the at least one ground conductor and the VVM, wherein the at least one ground conductor lies across the plurality of signal conductors, separated from the signal conductor by the VVM.

2. The flexible circuit of claim 1, wherein at least one of the first and second flexible layers is made of a material selected from the group consisting of: a ribbon, mylar, polyimide and an electrically insulated film.

3. The flexible circuit of claim 1, wherein the VVM includes a binder that is pliable enough such that it can be flexed with the flexible circuit without cracking.

4. The flexible circuit of claim 1, which includes an intermediate insulation layer between at least one of: (i) the signal conductors, (ii) the at least one ground conductor and (iii) VVM and the second flexible layer.

5. The flexible circuit of claim 4, wherein the intermediate insulative layer is made of a material selected from the group consisting of: (i) a dry film photo-imageable coverlay, (ii) a spray liquid photo-imageable coverlay and (iii) a glob-coating.

6. The flexible circuit of claim 1, which includes a silver ink coating applied to at least one of the signal conductors, the at least one ground conductor and the VVM.

7. The flexible circuit of claim 1, wherein the VVM covers at least substantially all of an entire surface of the signal conductors and the at least one ground conductor.

8. The flexible circuit of claim 1, wherein the VVM is applied to a portion of the signal conductors and the at least one ground conductor.

9. The flexible circuit of claim 1, wherein the at least one ground conductor and the VVM are in a z-direction relationship with the plurality of signal conductors.

10. The flexible circuit of claim 1, further comprising at least one of: (i) an internal insulating layer; and (ii) a intermediate silver ink coating.

11. The flexible circuit of claim 1, wherein the VVM includes one of: (i) an insulating binder, first conductive particles with a core and a shall held in the insulating binder, and second conductive particles without a shell held in the insulating binder; (ii) an insulating binder, first conductive particles with a core and a shell held in the insulating binder, second conductive particles without a shell held in the insulating binder, and semi-conductive particles with a core and a shell held in the insulating binder; and (iii) a insulating binder and only first conductive particles with a core and shell held in the insulating binder.

12. A flexible circuit having overvoltage protective comprising:
    a first flexible layer;
    a plurality of signal conductors applied to the first substrate layer;
    a voltage variable material ("VVM") applied to the plurality of signal conductors;
    a ground conductor applied to the VVM and across the signal conductors, wherein the ground conductor extends across the signal conductors to a ground trace applied to the first flexible layer;
    a first gap filled with the VVM between each adjacent signal conductor, the first gap larger than a second gap filled with the VVM between each signal conductor and the ground conductor; and
    a second flexible layer covering the signal conductors, the ground conductor and the VVM.

13. The flexible circuit of claim 12, which includes at least one of: (i) an internal insulating layer; and (ii) a intermediate silver ink coating.

14. The flexible circuit of claim 12, further comprising a plurality of signal conductors, each signal conductor lying adjacent to one of the ground conductors, separated by the VVM.

15. A flexible circuit having overvoltage protection comprising:
    a first flexible layer;
    a signal conductor applied to the first flexible layer;
    a second flexible layer;
    a ground conductor applied to the second flexible layer; and
    a voltage variable material ("VVM") located between the signal and ground conductors, wherein the VVM includes one of: (i) an insulating binder, first conductive particles with a core and a shell held in the insulating binder, and second conductive particles without a shell held in the insulating binder; (ii) an insulating binder, first conductive particles with a core and a shell held in the insulating binder, second conductive particles without a shell held in the insulating binder, and semi-conductive particles with a core and a shell held in the insulating binder; and (iii) a insulating binder and only first conductive particles with a core and shell held in the insulating binder.

16. The flexible circuit of claim 15, wherein at least one of the first and second flexible layers is made of a material selected from the group consisting of: a ribbon, mylar, polyimide and an electrically insulated film.

17. The flexible circuit of claim 16, the VVM separating the signal conductors and the ground conductor by a gap, each signal conductor spaced away from an adjacent signal conductor by a distance larger than the gap.

18. The flexible circuit of claim 15, which includes a plurality of signal conductors applied to the first flexible layer.

19. A flexible circuit having overvoltage protection comprising:
- a first flexible layer;
- a plurality of signal conductors applied to the first flexible layer;
- at least one ground conductor positioned adjacent to at least one of the signal conductors;
- a layer of voltage variable material ("VVM") applied to the plurality of signal conductors and the at least one ground conductor such that a first path through the VVM from any of the signal conductors to the at least one ground conductor is smaller than a second path through the VVM from any of the signal conductors to a closest adjacent signal conductor; and
- a second flexible layer covering the signal conductors,
- wherein the at least one ground conductor comprises a plurality of ground conductors, the VVM and each of the signal conductors in an x-y direction relationship with one of the plurality of ground conductors.

20. A flexible circuit having overvoltage protection comprising:
- a first flexible layer;
- a plurality of signal conductors applied to the first flexible layer;
- at least one ground conductor positioned adjacent to at least one of the signal conductors;
- a layer of voltage variable material ("VVM") applied to the plurality of signal conductors and the at least one ground conductor such that a first path through the VVM from any of the signal conductors to the at least one ground conductor is smaller than a second path through the VVM from any of the signal conductors to a closest adjacent signal conductor; and
- a second flexible layer covering the signal conductors, wherein each of the signal conductors lies adjacent to the at least one ground conductor, separated by the VVM.

* * * * *